(12) United States Patent
Imry et al.

(10) Patent No.: US 10,777,727 B2
(45) Date of Patent: Sep. 15, 2020

(54) EFFICIENCY-ENHANCED THERMOELECTRIC DEVICES

(75) Inventors: Yoseph Imry, Tel Aviv (IL); Ora Entin-Wohlman, Raanana (IL); JianHua Jiang, Rehovot (IL)

(73) Assignees: YEDA RESEARCH AND DEVELOPMENT CO. LTD., Rehovot (IL); BEN GURION UNIVERSITY OF THE NEGEV RESEARCH AND DEVELOPMENT AUTHORITY, Beer Sheva (IL)

( * ) Notice: Subject to any disclaimer, the term of this patent is extended or adjusted under 35 U.S.C. 154(b) by 445 days.

(21) Appl. No.: 14/343,168

(22) PCT Filed: Sep. 9, 2012

(86) PCT No.: PCT/IL2012/050355
§ 371 (c)(1),
(2), (4) Date: Jun. 3, 2014

(87) PCT Pub. No.: WO2013/035100
PCT Pub. Date: Mar. 14, 2013

(65) Prior Publication Data
US 2014/0326286 A1  Nov. 6, 2014

Related U.S. Application Data

(60) Provisional application No. 61/646,295, filed on May 13, 2012, provisional application No. 61/550,407, filed on Oct. 23, 2011, provisional application No. 61/532,124, filed on Sep. 8, 2011.

(51) Int. Cl.
*H01L 35/32* (2006.01)
*F25B 21/04* (2006.01)
*H01L 29/739* (2006.01)

(52) U.S. Cl.
CPC .............. *H01L 35/32* (2013.01); *F25B 21/04* (2013.01); *H01L 29/7391* (2013.01)

(58) Field of Classification Search
CPC ................................. H01L 35/32; F25B 21/04
USPC ..................................... 136/203, 205; 62/3.7
See application file for complete search history.

(56) References Cited

U.S. PATENT DOCUMENTS

| | | | |
|---|---|---|---|
| 2003/0218209 A1 | 11/2003 | D'Anna et al. | |
| 2006/0097241 A1* | 5/2006 | Harris | C30B 29/68 257/9 |
| 2006/0225773 A1* | 10/2006 | Venkatasubramanian | B82Y 10/00 136/205 |

(Continued)

FOREIGN PATENT DOCUMENTS

| | | |
|---|---|---|
| EP | 0526897 A2 | 2/1993 |
| WO | WO 2009/052920 A2 | 4/2009 |

OTHER PUBLICATIONS

Prance et al., "Electronic Refrigeration of a Two-Dimensional Electron Gas", Physical Review Letters, vol. 102, Apr. 2009, pp. 146602-1-146602-4.*

(Continued)

*Primary Examiner* — Tae-Sik Kang
(74) *Attorney, Agent, or Firm* — Mark S. Cohen; Pearl Cohen Zedek Latzer Baratz LLP

(57) ABSTRACT

An efficiency-enhanced, three-terminal, bi-junction thermoelectric device driven by independently-adjustable parameters of temperature and voltage.

19 Claims, 11 Drawing Sheets

(56) References Cited

U.S. PATENT DOCUMENTS

| | | | |
|---|---|---|---|
| 2008/0108227 A1 | 5/2008 | Kumagai et al. | |
| 2013/0009132 A1* | 1/2013 | McCann | H01L 35/16 257/15 |

OTHER PUBLICATIONS

Ambegaokar et al., "Hopping Conductivity in Disordered Systems", Phys. Rev. B 4, 2612 (1971).
Cai et al.; "Transport properties of quantum dot arrays", Phys. Rev. B 78, 035115 (2008).
Chung et al.; "CsBi4Te6: A High-Performance Thermoelectric Material for Low-Temperature Applications", Science 287, 1024 (2000).
Cutler et al.; "Observation of Anderson localization in an electron Gas", Phys. Rev. 181,1336 (1969).
Dresselhaus et al.; "New directions for low-dimensional thermoelectric Materials", Adv. Mater. 19, 1043 (2007).
Edwards et al.; "A quantum-dot refrigerator", Appl. Phys. Lett. 63, 1815 (1993).
Edwards et al.; "Cryogenic cooling using tunneling structures with sharp energy features", Phys. Rev. B 52, 5714 (1995).
Entin-Wohlman et al.; "Three-terminal thermoelectric transport through a molecular junction", arXiv:1005.3940, Phys. Rev. B 82, 115314 (2010).
Entin-Wohlman et al.; "Three-terminal thermoelectric transport through a molecule placed on an Aharonov-Bohm ring", Phys. Rev. B 85, 085401 arXiv:1105.3994, 2011.
Goldsmid; "Introduction to Thermoelectricity", (Springer, Heidelberg, 2009).
Humphrey et al.; "Reversible Thermoelectric Nanomaterials", Phys. Rev. Lett. 94, 096601 (2005).
Hyldgaard et al.; "Phonon superlattice transport", Phys. Rev. B 56, 10754 (1997).
Jeong et al.; "On the Best Bandstructure for Thermoelectric Performance", arXiv:1103.1274, 2011.
Jiang et al.; "Thermoelectric three-terminal hopping transport through one-dimensional nanosystems", Phys. Rev. B 85, 075412 (2012).
Kratzer et al.; "Modeling materials with optimized transport properties", arXiv:1011.0324.
Mahan et al.; "The best thermoelectric", Sofo, Proc. Natl. Acad. Sci. 93, 7436 (1996).
Mahan et al.; "Multilayer Thermionic Refrigeration", Phys. Rev. Lett. 80, 4016 (1998).
Mahan; "Thermionic refrigeration", J. Appl. Phys. 76, 4362 (1994).
Mickevicius et al.; "Hot intervalley phonons in GaAs", J. Phys.: Condens. Matter 2, 7883 (1990).
Miller et al.; "Impurity conduction at low concentrations", Phys. Rev. 120, 745 (1960).
Mott; "Conduction in Non-crystalline Materials, III. Localized States in a Pseudogap and Near Extremities of Conduction and Valence Bands", Philosophical Magazine, vol. 19, Issue 160, 1969, pp. 835-852.
Nakpathomkun et al.; "Thermo-electric efficiency at maximum power in low- dimensional systems", Phys. Rev. B 82, 235428 (2010).
Sanchez et al.; "Optimal energy quanta to current conversion", Phys. Rev. B 83, 085428, (2011).
Saramat et al.; "Large thermoelectric figure of merit at high temperature in Czochralski-grown clathrate Ba8Ga16Ge30", J. Appl. Phys. 99, 023708 (2006).
Shakouri; "Recent Developments in Semiconductor Thermoelectric Physics and Materials"Ann. Rev. of Mater. Res. 41, 399 (2011).
Shakouri et al.; "Heterostructure integrated thermionic coolers", Appl. Phys. Lett. 71, 1234 (1997).
Shockley; "Electrons and Holes in Semiconductors", (D. Van Nostrand Company, Inc., New York), 1950.
Sivan et al.; "Multichannel Landauer formula for thermoelectric transport with application to thermopower near the mobility edge", Phys. Rev. B 33, 551 (1986).
Snyder et al.; "Complex thermoelectric materials", Nat. Mater. 7, 105 (2008).
Sothmann et al.; "Rectification of thermal fluctuations in a chaotic cavity heat engine", Physical Review B 85, 205301 (2012).
Sze et al.; "Physics of semiconductor devices", (John Wiley and Sons, 2007).
Tal et al.; "Molecular signature of highly conductive metal-molecule-metal junctions", Phys. Rev. B 80, 085427 (2009).
Tang et al.; "Preparation and thermoelectric transport properties of high-performance p-type Bi2Te3 with layered nanostructure", Appl. Phys. Lett. 90, 012102 (2007).
Tubino et al.; "Lattice Dynamics and Spectroscopic Properties by a Valence Force Potential of Diamondlike Crystals: C, Si, Ge, and Sn", The Journal of Chemical Physics vol. 56. No. 3 Feb. 1, 1972.
Vashaee et al.; "Electronic and thermoelectric transport in semiconductor and metallic superlattices", J. Appl. Phys. 95, 1233 (2004).
Willardson et al., editors; "Semiconductors and Semimetals", chap. 5, vol. 5, 1970.
Zhou et al.; "Optimal Bandwidth for High Efficiency Thermoelectrics", Phys.Rev. Lett. 107, 226601 (2011).
Ziman; "Elements of Advanced Quantum Theory", 1969, 269 pages.
Zippilli et al.; "Cooling carbon nanotubes to the phononic ground state with constant electron current", Phys. Rev. Lett. 102, 096804 (2009).
Zvyagin; "On the Theory of Hopping Transport in Disordered Semiconductors", Phys. Stat. Sol. (b) 58, 443 (1973).

* cited by examiner

EFFICIENCY-ENHANCED THERMOELECTRIC DEVICES

CROSS-REFERENCE TO RELATED APPLICATIONS

This application is a National Phase Application of PCT International Application No. PCT/IL2012/050355, International Filing Date Sep. 9, 2012; claiming priority of U.S. Provisional Patent Application No. 61/532,124 filed Sep. 8, 2011, US Provisional Patent Application No. 61/550,407 filed Oct. 23, 2011, and U.S. Provisional Patent Application No. 61/646,295 filed May 13, 2012, all of which are hereby incorporated by reference.

FIELD OF THE INVENTION

The present invention relates to thermoelectric devices, and particularly, relates to efficiency-enhancing schemes.

BACKGROUND OF THE INVENTION

Electrical devices which make use of thermoelectric effects are well-known, and include devices which rely on physical effects including the Seebeck effect (electrical currents generated by temperature differences in junctions of dissimilar materials), the Peltier effect (emitting and absorbing of heat caused by electrical current flowing through junctions of dissimilar materials), and the Thomson effect (emitting or absorbing of heat by a current-carrying electrical conductor with a temperature gradient). The coefficients of these effects are related. Physically, these effects involve energy interchange between charge carriers and thermal phonons in the materials.

An example of a practical application of thermoelectric properties of materials is a Peltier refrigerator, which uses the Peltier effect to create a heat pump at the junction of two dissimilar materials. The Peltier refrigerator offers the benefits of small size, flexible shape, and lack of circulating fluids. Except for specialized uses which require such advantages, however, current Peltier refrigerators suffer from poor efficiency when compared against conventional vapor-compression fluid (reverse Rankine cycle) refrigerators. Fluid refrigerators typically exhibit effective efficiencies in the order of 50%, whereas the thermoelectric junctions of Peltier refrigerators typically achieve effective efficiencies in the order of 10%.

Other practical applications of thermoelectric properties of materials include heaters and thermoelectric power generators, and battery chargers. Such devices are typically based on variations in the configuration of the dissimilar materials and the polarity of the electrical current. For example, a Peltier refrigerator, being essentially a thermoelectric energy converter, can be configured to serve as a heater by reversing the current flow. In general, however, present thermoelectric devices typically exhibit poor conversion efficiencies. Nevertheless, they are being used in several special situations and many more are envisaged should the efficiency increase significantly.

SUMMARY OF THE INVENTION

According to embodiments of the invention, there is provided a bi-junction thermoelectric device having a thermoelectric gate interposed between two electric regions. Each electric region is connected to an electrical terminal and a heat conducting, thermal terminal is connected to the thermoelectric gate so as to enable heat transfer between the terminal and the thermoelectric gate, according to embodiments. It should be appreciated that the thermoelectric device is reversible; transfer of heat between the thermal terminal and the thermoelectric gate can cause current flow between the terminals. The advantage afforded by the invention over present thermoelectric devices can be analyzed using the (matrix) equation characterizing thermoelectric linear transport for devices according to embodiments of the invention is:

$$\begin{pmatrix} I_e \\ I_Q^e \\ I_Q^{pe} \end{pmatrix} = \begin{pmatrix} G & L_1 & L_2 \\ L_1 & K_e^0 & L_3 \\ L_2 & L_3 & K_{pe} \end{pmatrix} \begin{pmatrix} \delta\mu/e \\ \delta T/T \\ \Delta T/T \end{pmatrix},$$

where $I_Q^{pe}$ is the heat current exchanged between electrons and phonons in the thermoelectric gate, $L_2$ and $L_3$ are additional thermoelectric transport coefficients of the material of the thermoelectric gate, $K_{pe}$ is the heat conductance between the phonons and electrons in the thermoelectric gate, and $\Delta T/T$ is the normalized temperature differential between the thermal terminal and the electrical terminals.

Thus, in addition to the parameters G, $L_1$, and $K_e^0$, embodiments of the invention offer the possibility of also adjusting parameters $L_2$, $L_3$, and $K_{pe}$ to further optimize device performance. Moreover, the inclusion of the thermal terminal connected to the thermoelectric gate affords additional opportunities for improving device operation. An example being the use of both temperature difference and voltage across the electrical terminals to cool the thermal one.

BRIEF DESCRIPTION OF THE DRAWINGS

The subject matter disclosed may best be understood by reference to the following detailed description when read with the accompanying drawings in which:

FIG. 8b shows the relative change of S as a function of the the system length W=(4L$_M$), obtained by averaging over $10^6$ random configurations. Parameters are the same as in 8a.

Figure 1:
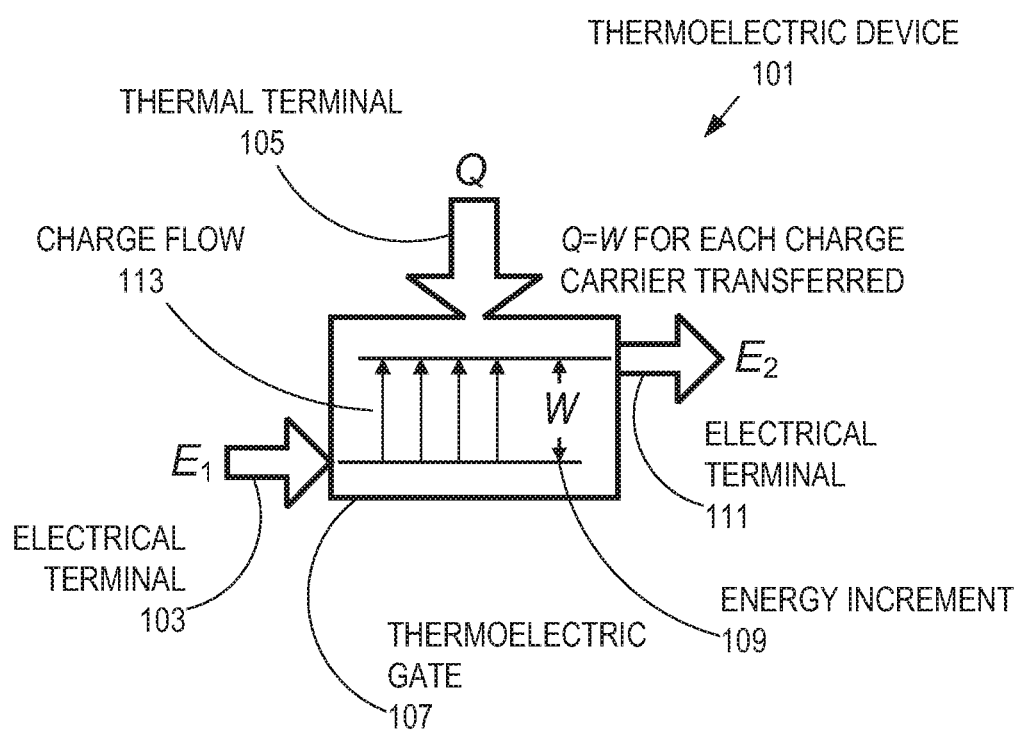
FIG. 1 is an energy-level model diagram of a thermoelectric device according to various embodiments of the invention.

For clarity of illustration, embodiments of the invention are described herein in terms of a thermoelectric cooling device configuration (such as a refrigerator). It is understood, however, that the descriptions and illustrations are non-limiting, and that devices according to embodiments of the present invention encompass other thermoelectric device configurations, including, but not limited to: heating devices; and thermoelectric energy conversion devices. Devices applying semiconductor junctions play an important role, but are not the only possibility. For example, normal metal-superconductor junctions play important roles in low-temperature (cryogenic) cooling.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

DETAILED DESCRIPTION OF EMBODIMENTS OF THE INVENTION

In an effort to improve efficiencies of thermoelectric devices, this invention provides modifying the thermoelectric properties of materials in thermoelectric devices. A "figure of merit" Z is commonly used to assess the thermoelectric performance of a material.

$$Z = \frac{GS^2}{K},$$ (Equation 1)

where G is the material's electrical conductance, S is the Seebeck coefficient of the material, and K is the material's thermal conductance. Thermal conductance K is the sum of two components: electronic conductance Ke, and phonon conductance Kph (K=Ke+Kph). Informally, it is seen that the thermoelectric performance increases as the Seebeck coefficient and the electrical conductance increase and as the thermal conductance decreases. For example, a material that is a good conductor of electricity, a good insulator of heat and has a good Seebeck coefficient will have a high figure of merit. In reality, however, electrical conductance and heat conductance are not independent, so that Z cannot be arbitrarily adjusted. The figure of merit is also expressed as a dimensionless constant ZT when multiplied by the average temperature T of the two electrical terminals of the thermoelectric device. The efficiency is defined as the ratio of the delivered power to the consumed one, and it is a simple, monotonically increasing, function of ZT.

Although advances have been made in increasing the figure of merit for bulk materials, opportunities for improving the figure of merit of present thermoelectric devices are limited to adjusting, as much as possible, the three parameters G, L$_1$, and K$_e^0$ of the following equation that characterizes thermoelectric linear transport for current thermoelectric devices:

$$\begin{pmatrix} I_e \\ I_Q^e \end{pmatrix} = \begin{pmatrix} G & L_1 \\ L_1 & K_e^0 \end{pmatrix} \begin{pmatrix} \delta\mu/e \\ \delta T/T \end{pmatrix},$$

where I$_e$ is the electrical charge current, I$_Q^e$ is the electrical charge contribution to the heat current, L$_1$ is a thermoelectric coefficient of the material, K$_e^0$ is the material's electrical charge contribution to the thermal conductance, $\delta\mu/e$=V is the voltage drop across the two terminals, and $\delta T/T$ is the normalized temperature differential across the two terminals. These parameters are related to other thermoelectric characteristics of the materials. For example, the Seebeck coefficient S is given by S=L$_1$/G. Thus, improving the figure of merit for present thermoelectric devices is limited by the extent to which G, L$_1$, and K$_e^0$ can be adjusted, while trying to minimize K$_{ph}$.

As noted above the present invention is directed at enhancing the efficiency of thermoelectric devices. Generally speaking, the efficiency may be enhanced by either contacting a thermal terminal configured to supply heat with a thermoelectric device so as to form a three-terminal device or doping the two electrical terminals of a P$_+$-P$_-$ or N$_+$-N$_-$ junction to different degrees. According to embodiments of the invention, one of two electrical terminals is heavily doped (P$^+$ or N$_+$) while the remaining terminal is lightly doped (N− or P−). By light doping one usually means doping concentrations in the range of $10^{15}$-$10^{16}$ dopants (donors or acceptors)/cc. Heavy doping usually means such concentrations in the range of $10^{18}$-$10^{19}$/cc.

Using the homopolar configuration (only N or only P) has an advantage of avoiding the usual cancellation between electron and the hole contributions, which often limits thermoelectric efficacy. However, the bipolar configuration has its own strong points.

Turning now to the figures, FIG. 1 is an energy-level model diagram of a thermoelectric device 101 according to various embodiments of the invention. A first electrical terminal 103 (i.e., an electrically-conducting connective element) is operative to input charge carriers into a thermoelectric gate 107 at an energy E. A thermal terminal 105 (i.e., a heat-conducting connective element) is operative to input heat Q into thermoelectric gate 107. In non-limiting embodiments, thermal terminal 105 is configured to input Q units of heat for each transferred electron. Typical values of Q are in the range of 3-7 kT (i. e. 0.1 to 0.25 electron volts for room temperature operation). A second electrical terminal 111 is operative to remove charge carriers from thermoelectric gate 107 at an energy E2. An energy increment W 109 equals the energy differential between first electrical terminal 103 and second electrical terminal 111, namely W=E2−E1. (For an effective energy barrier between the two electric terminals, W equals the barrier height within the order of kT, wherein k is Boltzmann's constant and W>>kT, according to non-limiting embodiments.) A bath of thermal phonons at a temperature T interact with charge carriers in the thermoelectric gate 107 and transfer energy W to each charge carrier, in order to transverse the thermoelectric gate 107. As noted in FIG. 1, heat energy of Q=W is transferred to each charge carrier in the thermoelectric gate 107 to establish a charge flow 113. In this fashion, the thermoelectric device 101 functions as a cooling device by removing heat Q from an external heat source through thermoelectric gate 107 via the thermal terminal 105, according to embodiments. It should be noted that in certain embodiments the thermal terminal 105 is integrally connected with the thermoelectric gate 107. As noted previously, this configuration is non-limiting, and other thermoelectric configurations according to further embodiments of the invention are possible. There are several possibilities to choose the semiconducting materials. Notably, II-VI family semiconductors, such as BiTe (the work-horse of present thermoelectric devices) or $Hg_{1-x}Cd_xTe$ (mentioned below for special advantages). But materials of the III-V family (e.g. GaAs) even more common ones such as Si and Ge, may turn out to be useful. Metallic elements and metal-semiconductor interfaces may play a role as well. All this is to be regarded as non-limiting.

Figure 2:
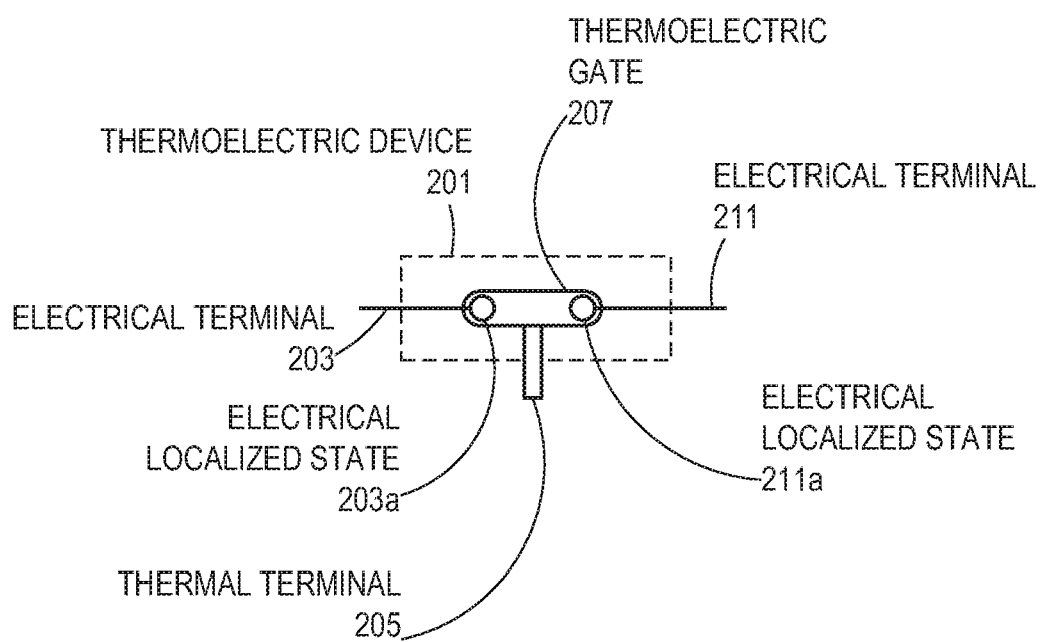
FIG. 2 shows a configuration of a thermoelectric device according to an embodiment of the invention.

FIG. 2 shows a configuration of a thermoelectric device 201 according to another embodiment of the invention. A first electrical terminal 203 is in electrical contact with a first electrical localized state 203a within a thermoelectric gate 207, which is connected to a thermal terminal 205. A second electrical terminal 211 is in electrical contact with a second electrical localized state 2111a within thermoelectric gate 207. In a related embodiment of the invention, localized states are provided by quantum dots; in another related embodiment of the invention, localized states are provided by diatomic molecules.

Figure 3:
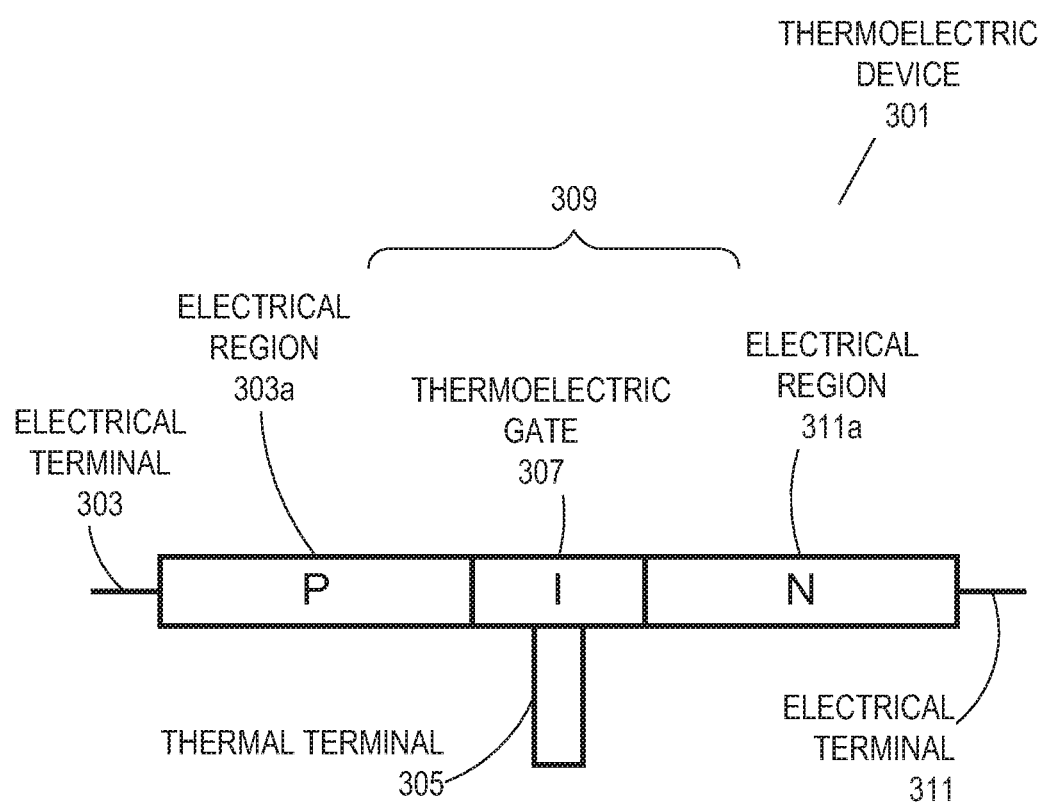
FIG. 3 shows a configuration of a thermoelectric device according to another embodiment of the invention.

FIG. 3 shows a configuration of a thermoelectric device 301 according to another embodiment of the three-terminal thermoelectric device. A first electrical terminal 303 is in electrical contact with a first electrical region 303a, which is a positive region in a P-I-N junction 309. A thermal terminal 305 is in thermal contact with a thermoelectric gate 307, which is an intrinsic region in P-I-N junction 309. A second electrical terminal 311 is in electrical contact with a second electrical region 311a, which is a negative region in P-I-N junction 309. Thermoelectric gate 307 provides an effective energy barrier between first electrical region 303a and second electrical region 311a.

In another embodiment of the invention, a semiconductor material is selected whose optical phonon frequency v is close to the electronic band gap W (that is, a material for which hv≈W), This happens in extremely narrow-gap semiconductors like $Hg_{1-x}Cd_xTe$ in which the band-gap varies from 0 to 1.5 eV when "x" is changed.

It should be appreciated that according to certain embodiments, metal-semiconductor-metal junctions, may also be formed from metal-semiconductor-metal junctions providing the functionality associated with junctions constructed of Au-p-type Si—Au, or a superlattice separating the two metallic electrodes, where the Fermi level is inside the gap is between the "valence" and "conduction" bands of the superlattice.

Figure 4A:
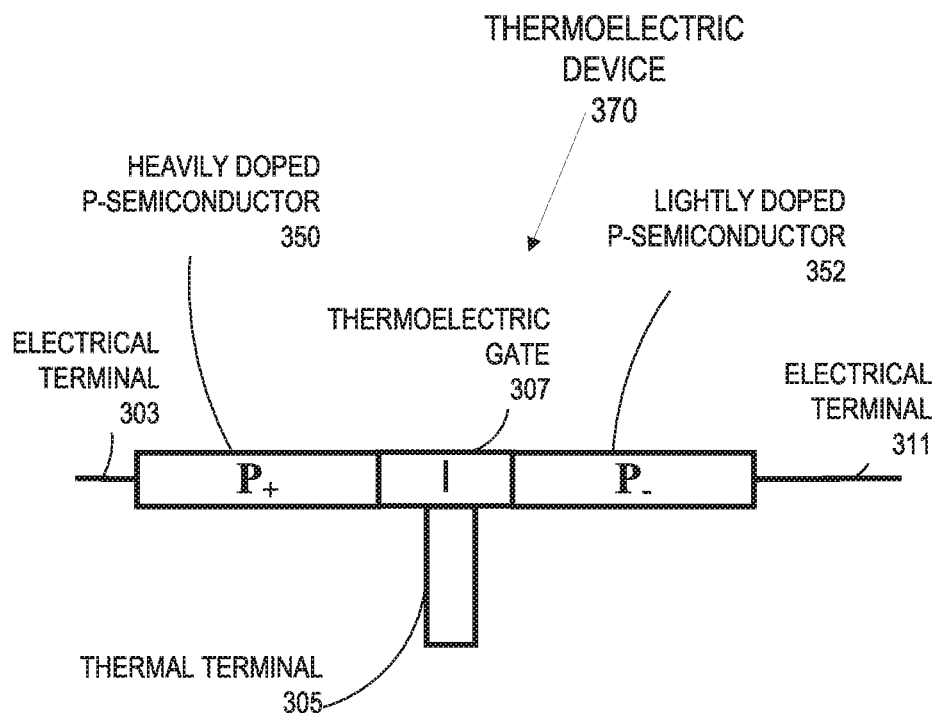
FIGS. 4A and 4B show thermoelectric devices according to further embodiments of the present invention employing semiconductors having the same type of doping; but, widely varying in the degree of doping.
Figure 4B:
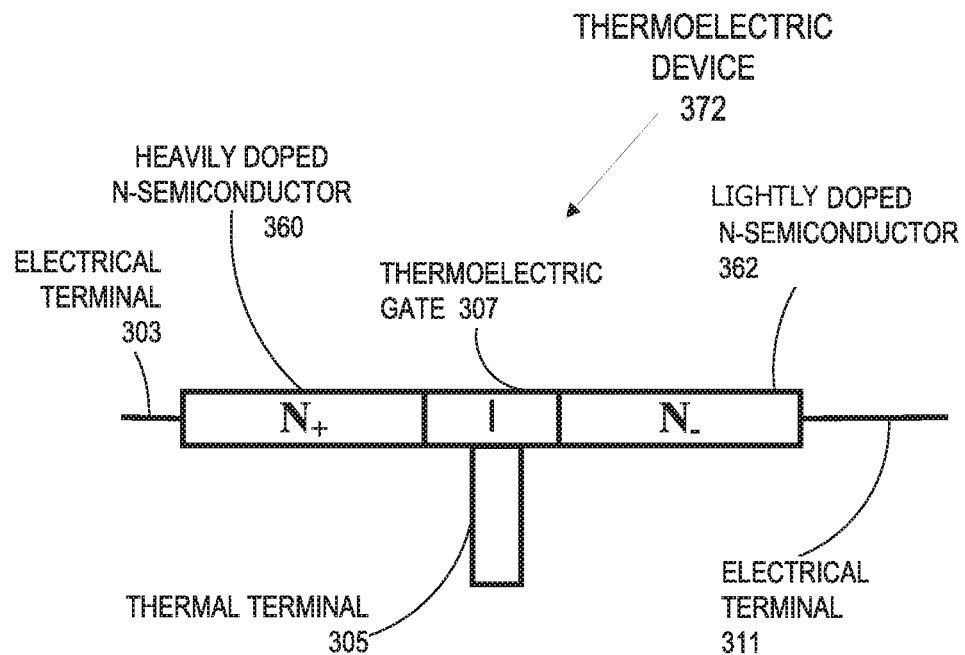

An aspect of some embodiments of the invention is that the thermal terminal (e.g., thermal terminal 305 of FIG. 3) is in direct thermal contact with the thermoelectric gate (e.g., thermoelectric gate 307 of FIG. 3). That is, there is no other component, structure, thermal conductor, or other material between the thermal terminal and the thermoelectric gate. In other embodiments of the invention, the thermal terminal is not in direct thermal contact with any electrical region connected to an electrical terminal (e.g., electrical region 303a or electrical region 311a). Furthermore, in some embodiments, the electrical terminals are thermally isolated from the thermal one. It should be appreciated that the energy differential W is substantially greater than kT, wherein k is Boltzmann's constant FIGS. 4A and 4B depict alternative embodiments of an efficiency-enhanced thermoelectric device based on differing degrees of "P" or "N" doping. Specifically, device 370 shown in FIG. 4A has a junction of heavily p-doped semiconductor 350 and lightly p-doped semiconductor 352 in contact with electrical terminals 303 and 311, respectively. Analogously, device 372 shown in FIG. 4B has a junction of heavily n-doped semiconductor 360 and lightly n-doped semiconductor 362 in contact with electrical terminals 303 and 311, respectively. Non-limiting embodiments have a doping differential of roughly the higher doping level ($10^{18-19}$ dopants/cc), the doping differential for n-doped embodiments is similar.

Figure 5:
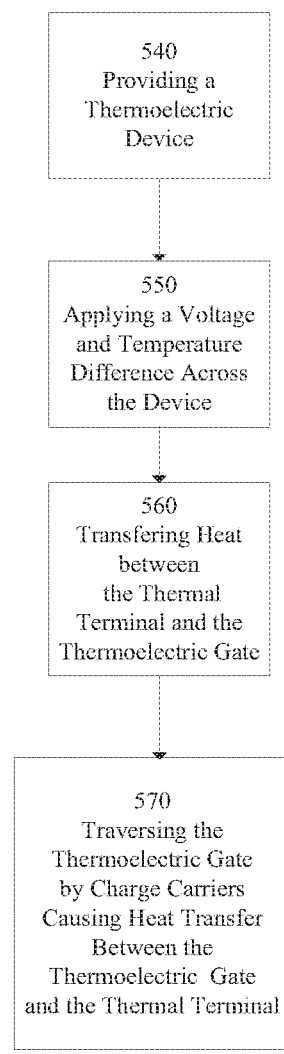
FIG. 5 is a flow diagram depicting operational steps of the present invention, according to embodiments.

FIG. 5 is a flow chart depicting the steps of operation for three-terminal embodiments of thermoelectric devices. After the device is provided in step 540, a voltage is applied collectively across both of the electrically active regions in step 550. Furthermore, in some embodiments the first and the second electrical regions are set at different temperatures by way of a temperature control configuration. For example, such temperature differences may be achieved by contacting each of the electrical regions with a separate heat source, each source having a different temperature.

It should be appreciated that temperature-control configuration configured to produce a temperature between either one of the electrical regions and the thermoelectric gate are also included in the scope of the present invention.

In step 560 heat is transferred between the thermoelectric gate and the thermal terminal and the direction of the heat transfer is a function of the direction of the current flow between the terminals, according to embodiments. In some embodiments, heat transfer causes a corresponding flow of current between the electrical terminals, and analogously, the direction of the resulting current flow is a function of the heat transfer.

In step 570, charge carriers traverse the thermoelectric gate causing heat transfer between the thermoelectric gate and the thermal terminal.

Figure 6:
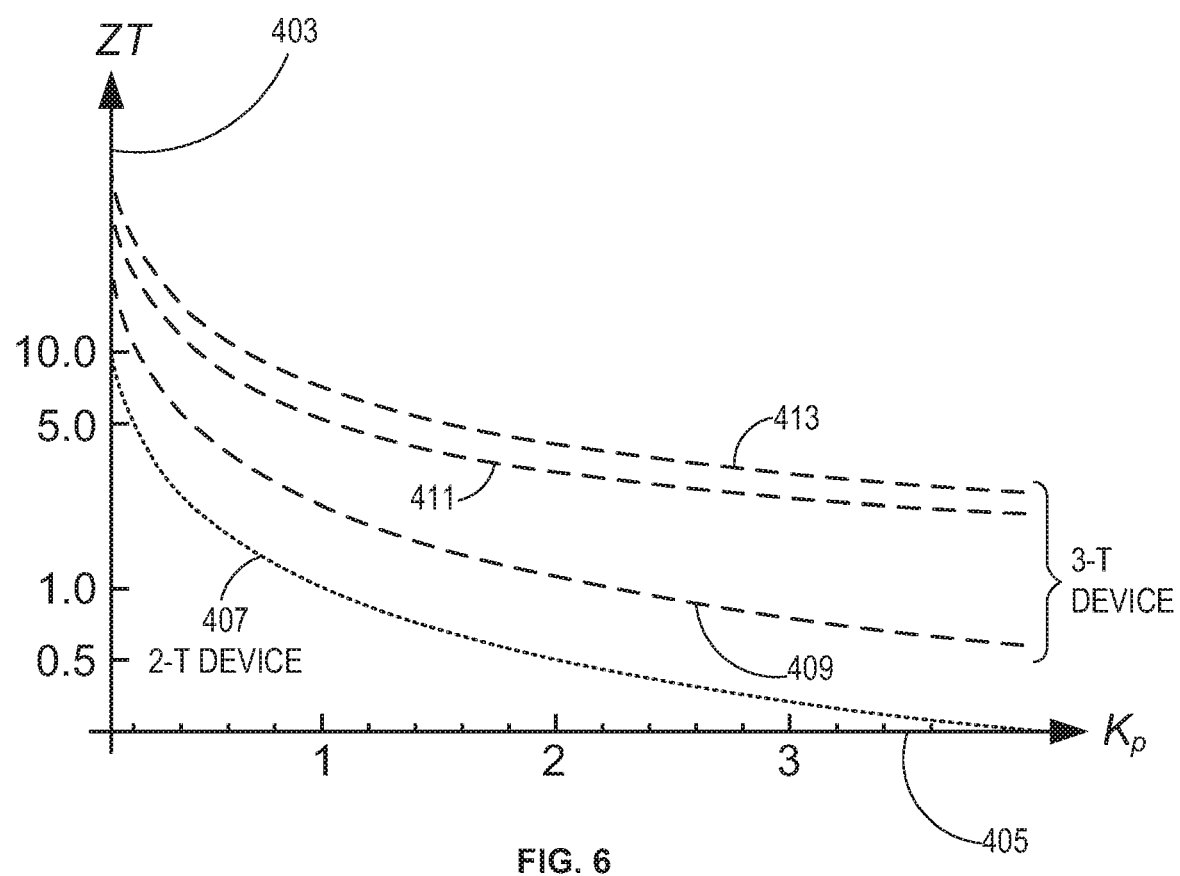
FIG. 6 shows figure-of-merit curves for thermoelectric device configurations according to embodiments of the invention in comparison with a figure-of-merit curve for a corresponding conventional thermoelectric device.

Potential advantages offered by the 3-terminal thermoelectric devices, according to embodiments of the present invention are quantitatively illustrated in FIG. 6 as a graph 401 of figure-of-merit curves, for three-terminal ("3-T") thermoelectric device configurations according to embodiments of the present invention in comparison with a figure-of-merit curve 407 for a corresponding conventional two-terminal ("2-T") thermoelectric device. Figure of merit is normalized and dimensionless as ZT in FIG. 6.

Thus, in FIG. 6, the figure of merit for cooling one of the electric terminals is plotted logarithmically on a vertical axis 403 against the parasitic phonon heat conductance $K_p$ on a horizontal axis 405, $K_p$ is very often the crucial limiting factor for such devices. Figure-of-merit curve 409 is for a three-terminal device having only a voltage difference across the electrical terminals. Figure-of-merit curve 411 is for a three-terminal device having only a temperature difference between the thermal terminal and the electrical terminals. Figure-of-merit curve 413 is for a three-terminal device having both a temperature difference between the thermal terminal and the electrical terminals and a voltage difference across the electrical terminals.

The advantage of the three-terminal configuration (especially when driven by both temperature difference and voltage) over the two-terminal one is seen from Curve 413, which illustrates the advantages afforded by embodiments of the present invention, in providing two independently-adjustable input parameters (voltage and temperature) as "driving fields" for optimizing figure of merit.

Following are three non-limiting embodiments of the present invention.

The first example of an embodiment relates to "Thermoelectric Three-Terminal Hopping Transport Through One-Dimensional Nano-systems".

In thermoelectric transport temperature differences can be converted to (or generated by) electric voltages. Such phenomena have already found several useful applications. The need for higher performance thermoelectrics as well as the pursuit of understanding of various relevant processes (especially the inelastic ones) motivated a significant research effort. Theory predicts that high values of the thermopower follow when the conductivity of the carriers depends strongly on their energy. Indeed, in bulk systems, the thermoelectric effects come from the electron-hole asymmetry which is often rather small. However, in nanosystems, due to intrinsic fluctuations, such asymmetry can arise in individual samples in ensembles with electron-hole symmetry on average. Moreover, the inelastic processes and interference/dissipation effects may play nontrivial roles in thermoelectric transport in nanosystems. It is known that the thermoelectric performance is governed by the dimensionless figure of merit ZT, where T is the common temperature of the system and $Z=\sigma S^2/\kappa_e+\kappa_{ph}$), with $\sigma$ being the electrical conductivity, S the Seebeck coefficient, and $\kappa_e$ and $\kappa_{ph}$ the electronic and the phononic heat conductivities, respectively. Both $\kappa_e$ and $\kappa_{ph}$ can be smaller in nanosystems than in bulk ones, opening a route for better thermoelectrics.

In one embodiment, three-terminal thermoelectric transport in small one-dimensional (1D) nanosystems accomplished via inelastic phonon-assisted hopping is considered, and that such interactions lead to several nontrivial properties. Conclusions are drawn for the simple, but important, two localized-state junction in which hopping is nearest-neighbor.

Model system. The Hamiltonian, $H=H_e+H_c-ph+H_{ph}$, consists of the electronic and phononic parts as well as the electron-phonon (e-ph) interaction. The electronic part is (electronic operators are denoted by c and c+)

$$H_e = \sum_i E_i c_i^\dagger c_i + \sum_{k(p)} \epsilon_{k(p)} c_{k(p)}^\dagger c_{k(p)} + \left( \sum_{i,k(p)} J_{i,k(p)} c_i^\dagger c_{k(p)} + \sum_i J_{i,i+1} c_i^\dagger c_{i+1} + H.c. \right). \quad (1)$$

Here i labels the localized states, of energies $E_i$, and $\kappa_{(p)}$ marks the extended states in the left (right) lead, of energies $\epsilon_k$ ($\epsilon_p$) (energies are measured from the common chemical potential, taken as zero). The matrix element (in units of energy) coupling the localized states to each other is $J_{i,i+1}$, and those coupling them to the lead states are $J_{i;k(p)}$ Both are exponentially decaying, with a localization length $\xi$, e.g.

$$J_{i,k(p)} = \alpha_e \exp\left(-\frac{|x_i - x_{L(R)}|}{\xi}\right), \quad (2)$$

with $x_i$ and $x_{L(R)}$ being the coordinates of the center of the localized states and the left (right) boundary, and $\alpha e$ yielding the coupling energy. The e-ph interaction is $$H_{e-ph} = \sum_q M_{q,ij} c_i^\dagger c_j (a_q + a_{-q}^\dagger) + H.c., \quad (3)$$

where the phonon modes, of wave vector q and frequency $\omega_q$ are described by the operators $\alpha_q^\dagger, \alpha_q$.

Figure 7A:
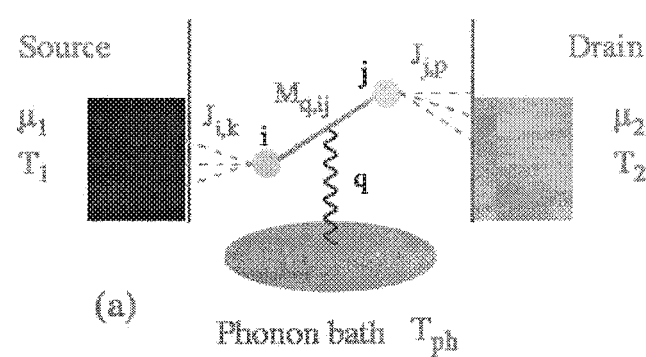
FIG. 7a shows a two localized-state (i and j, points) system coupled to two leads, of temperatures $T_L$ and $T_R$, and chemical potentials $\mu_L$ and $\mu_R$ (with the choice $\mu_L > \mu_R$ and $T_L > T_R$). The phonon bath temperature is $T_{ph}$. The localized states are coupled (dotted lines) to the continuum of states in the leads, and are also coupled to the phonon bath (the wavy line).

Their Hamiltonian is $H_{ph}=\Sigma_q \omega_q \alpha_q^\dagger \alpha_q$ (where $\hbar$ =1). The e-ph coupling energy is $M_{q,ij}=\alpha_{e-ph} \exp(-|x_i-x_j|/\xi)$, with $\alpha_{e-ph}=\lambda\alpha_e$ where $\lambda$ is a dimensionless e-ph coupling constant. The transport through the system is governed by hopping when the temperature is above a crossover temperature, $T\chi$, estimated below for the most important two-site case. At lower temperatures the dominant transport is via tunneling. The two-site example of the system is depicted in FIG. 7a.

Hopping and Interface Resistors.

The system described above bridges two electronic leads, held at slightly different temperatures and chemical potentials, $T_L$, $\mu_L$ and, $T_R$, $\mu_R$ such that the common temperature is $T=(T_L+T_R)/2$. The golden-rule transition rate $\Gamma_{ij}$, between two localized states, located at $x_i$ and $x_j$ and having energies Ei<0<Ej, necessitates the inelastic e-ph interaction, and reads $$\Gamma_{ij} = 2\pi \Gamma_{in} f_i (1-f_j) N_B(E_{ji}), \quad (4)$$

where $E_{ji} \equiv E_j - E_i$, the local Fermi function is $$f_i = \left[\exp\left(\frac{E_i - \mu_i}{k_B T_i}\right) + 1\right]^{-1}, \quad (5)$$

and $N_B$ is the Bose function $$N_B = [e^{\omega/(k_B T_{ph})} - 1]^{-1}, \quad (6)$$

determined by $T_{ph}$, the temperature of the phonon bath in Eq. (4) of this example, $\Gamma_{in}=|M_{q,ij}|^2 v_{ph}(|E_{ij}|)$, where $v_{ph}$ is the phonon density of states. The linear hopping conductance at long distances ($|x_i-x_j|\equiv|x_{ij}|>>\xi$) and high energies ($|E_i|, |E_j|>>k_B T$) of such a "bond" is $$G_{ij} \sim e^2|\alpha_{i-ph}|^2 v_{ph}(|E_{ij}|)/(k_B T)\eta_{ij}^{-1}, \quad (7)$$

$$\eta_{ij} = \exp\left(\frac{2|x_{ij}|}{\xi}\right)\exp\left(\frac{|E_i|+|E_j|+|E_{ij}|}{2k_B T}\right).$$

As opposed to Eq. (4) of this example, the tunneling conduction from, say, site i to the left lead can be accomplished by elastic processes with a transition rate $\Gamma_{iL} = \gamma_{iL} f_i (1-f_L)$, where $\gamma_{iL} = 2\pi |J_{ik}|^2 v_L(E_i)$ and $f_L$ and $v_L$ are the Fermi distribution and the density of states of the left lead. The corresponding linear interface conductance is then $G_{iL} \cong e^2|\alpha_e|^2 v_L(E_i)(k_B T)^{-1} \exp[-2|x_{iL}|/\xi - |E_i|/(k_B T)]$.

This conductance (and the interface conductance at the right lead) will be assumed to be much larger than the hopping conductance between two localized states.

Figure 7B:
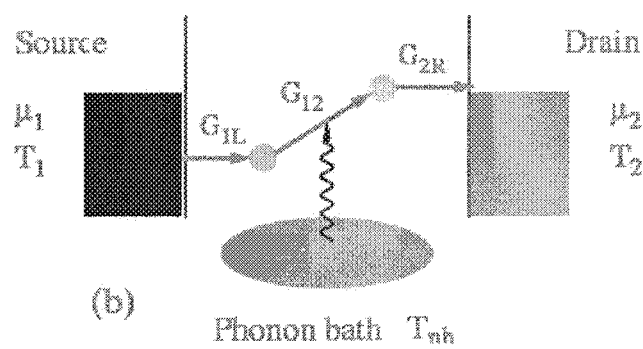
FIG. 7b shows the effective resistors representing the system: The straight arrows indicate the net electronic currents and the wavy one the phonon heat current, with $G_{1L}$, $G_{2R}$, and $G_{12}$ being the conductances of the tunneling and the hopping resistors, respectively.

Nanosystems with two localized states. The simplest example is that of a two-site system (i; j=1, 2) depicted in FIG. 7, which describes, e.g. a diatomic molecule or a series-connected double quantum dot. As site 1 (2) is in a good contact with left (right) lead, we may assume that the local chemical potential and temperature there are $\mu_{L(R)}$ and $T_{L(R)}$. The transport is dominated by the hopping from 1 to 2 when the temperature is higher than $T\chi$. This temperature is estimated from the requirement that the thermal-equilibrium (elastic) tunneling conductance across the system, $G_{tun}$, is comparable to the hopping one. The former is given by the transmission $\Sigma_{i=1,2}\Gamma_{iL}(E)\Gamma_{iR}(E)/[(E-E_i)^2+(\Gamma_{iL}(E)+\Gamma_{iR}(E))^2/4]$ where the tunneling rates are $\Gamma_{iL(R)}(E) = 2\pi|J_{i,k(p)}|^2 v_{L(R)}(E)$, Since site 1 (2) is coupled mostly to the left (right) lead, we use their perturbation-theory mixtures, governed by the small parameter J12=E21, where $E_{21} \equiv E_2 - E_1$. At low temperatures and for $|E_1|$, $|E_2| \gg \Gamma_1, \Gamma_2, |E_1|, |E_2| \gg \Gamma_1, \Gamma_2$, it is estimated for the state based on 1, $$G_{tun} \sim e^2 E_1^{-2}|\alpha_e|^2 v_L(0) v_R(0) E_{21}^{-2} \exp\left(-\frac{2W}{\xi}\right), \quad (8)$$

where W is the length of the system. The hopping conductance is given by Eqs. (7) of this example (with i;j=1, 2). Comparing those two, with exponential accuracy, the elastic tunneling mechanism can be important only when $\exp[-(|E_1|-|E_2|+|E_{12}|)/2kBt] \ll \exp[-2(W-|x_{12}|)/\xi]$, giving $k_B T_z \sim (|E_3|+|E_2|+|E_{12}|)\xi/[4(W-|x_{12}|)]$. (The two-site junction is assumed for simplicity to be normal to the leads' surfaces.)

Three-Terminal Thermoelectric Linear Transport.

The electronic particle current through the system is $$I_N \propto \Gamma_{12} - \Gamma_{21}, \quad (9)$$

[see Eq. (4) of this example]. For an electron transferred from left to right, the bath gives an energy -E1 (E2) to the left (right) lead, and thus the phonons transfer the energy $E_{21}$ to the electrons. A net energy of $2\bar{E} \equiv E_1 + E_2$ is transferred from left to right. Hence, the net electronic energy current, $I_Q^e$, and the heat current exchanged between the electrons and the phonons, $I_Q^{pe}$ are $$I_Q^e = \bar{E}I_N, \text{ and } I_Q^{pe} = E_{21}I_N. \quad (10)$$

The linear-response transport coefficients are obtained by expanding Eqs. (9) and (10) to the first order in $\delta T \equiv T_L - T_R$, $\delta \mu \equiv \mu_L - \mu_R$, and $\Delta T \equiv T_{ph} - T$, $$\begin{pmatrix} I_e \\ I_Q^e \\ I_Q^{pe} \end{pmatrix} = \begin{pmatrix} G & L_1 & L_2 \\ L_1 & K_e^0 & L_3 \\ L_2 & L_3 & K_{pe} \end{pmatrix} \begin{pmatrix} \delta \mu/e \\ \delta T/T \\ \Delta T/T \end{pmatrix}, \quad (11)$$

where $Ie = eI_N$ is the charge current. All transport co-effcients in Eq. (11) of this example are given in terms of the linear hopping conductance G [given by Eqs. (7)], $$L_1 = \frac{G}{e}\bar{E}, \quad L_2 = \frac{G}{e}E_{21}, \quad (12)$$

$$K_e^0 = \frac{G}{e^2}\bar{E}^2, \quad L_3 = \frac{G}{e^2}\bar{E}E_{21}, \quad K_{pe} = \frac{G}{e^2}E_{21}^2,$$

Note that $L_2$, $L_3$, and Kpe are related to $\Delta E$, because $I_Q^{pe}$ vanishes with $E_{21}$. The transport coefficients $L_2$ ($L_3$) correspond to, e.g., generating electronic current (energy current) via the temperature difference $\Delta T$. When reversed, this process performs as a refrigerator: Electric current pumps heat current away from the phononic system and cools it down. The efficiency of such a process will be discussed below. In analogy with the usual two-terminal thermopower S, here we use the three-terminal thermopower of this process.

$$S_p = \frac{L_2}{TG} = \frac{k_B}{e}\frac{E_{21}}{k_B T}. \quad (13)$$

Note that $S_p$ of our model can be very large as the energy taken from the phonons per transferred electron can be several times $\kappa_B T$. The role of the coefficent $K_{pe}$, yielding the heat conductance between the phononic and electronic systems, is discussed below.

Two-terminal figure of merit, for $\Delta T=0$. A significant feature of our setup is that the electronic heat conductance can vanish while the thermopower stays finite $$K_e = K_e^0 - \frac{L_1^2}{G} = 0, \quad S = \frac{L_1}{TG} = \frac{k_B}{e}\frac{\bar{E}}{k_B T}. \quad (14)$$

The largest two-terminal figure of merit is achieved in systems with the smallest $\kappa_e/(S^2\sigma)$. Here this ratio vanishes, and then $Z=\sigma S2/\kappa ph$ is limited by $\kappa ph$. The latter can be minute in nanosystems. Moreover, it can be reduced by manipulating phonon disorder and/or phonon-interface scattering (avoiding concomitantly drastic changes in the electronic system). The system is then expected to possess a high figure of merit.

Three-terminal figure of merit.

The three-terminal geometry suggests novel possibilities for thermoelectric applications. For example, when $\Delta T<0$ and $\delta\mu>0$, the setup is a refrigerator of the local phonon system, whose efficiency is given by the rate of the heat pumped from the phonon system to the work done by the electrical component, $$\eta = I_Q^{pe}/(I_e \delta\mu). \quad (15)$$

Consider first the special situation with $\bar{E}=0$, where $L_1 = K_e^0 = L_3 = 0$. For a given $\Delta T$, $\delta\mu$ is adjusted to optimize the efficiency, yielding $\eta=\eta_0\ (2+ZT-2\sqrt{ZT+1})/(\tilde{Z}T)$ where $\eta_0=\Delta T/T$ is the Carnot efficiency, and the new figure of merit is $$\tilde{Z}T = L_2^2/(GK_{pe} - L_2^2). \quad (16)$$

Inserting here Eqs. (12) yields $\tilde{Z}T \to \infty$ upon neglecting the "parasitic" conductances, which will be discussed below. When $\bar{E} \neq 0$, such an optimization can be achieved by setting $\delta T=0$, which is straightforward to do.

In reality, $\tilde{Z}T$ must be finite. To calculate a more realistic efficiency, Eq. (11) of this example is generalized by adding the elastic transmission, the tunneling conductance $G_{el}$, to the hopping conductance G, and the elastic component. $L_{1,el}$, to $L_1$. (The elastic transmission does not contribute to L2, L3, and Kpe, which are related to the heat transfer between the electronic and phononic systems.) The phonon heat conductance Kp, replacing $I_Q^e$ by $I_Q$; the total heat current from the left to the right lead ($\delta T$ is now also the temperature difference for the phononic systems in the left and right leads). Due to the absence of phonon-drag effects in localized electronic systems, the temperature difference $\delta T$ should not contribute to other currents beside I. Finally, there are phononic heat flows from the two leads to the system being cooled. Hence the numerator of Eq. (15) of this example is replaced by $I_Q^{pe}-K_{pp}\Delta T/T$, where Kpp describes the phononic heat conductance in such processes. Following the same procedure as above, the efficiency is optimized by setting $\delta T=0$ and adjusting $\delta\mu$. The result is similar, except that the figure of merit is modified, $$\tilde{Z}T = \frac{L_2^2}{(G + G_{el})(K_{pp} + K_{pe}) - L_2^2} \quad (17)$$

$$= \left[\frac{G_{el}}{G} + \frac{K_p}{K_{pe}} + \frac{G_{el}K_{pp}}{GK_{pe}}\right]^{-1}.$$

This has a straightforward physical interpretation: The wasted work is due to the elastic conductance and the unwanted heat diffusion, and $\tilde{Z}T$ is limited by the ratio of the waste to the useful powers. In nanosystems $K_{pp}$ can be limited by the contact between the system and the leads. Hence the ratios can be made small and $\tilde{Z}T$ can still be large. The three-terminal device can also serve as a heater and as a thermoelectric battery, where the same figure of merit describes the efficiency.

Longer 1D systems. For a chain of localized states, the picture is similar though slightly more complex. Consider first nearest-neighbor hopping, where the system is a chain of resistors. The same considerations as in the two-site case [in which the energy balance is between site 1 (2) and the left (right) lead] hold here for the leftmost, l, (rightmost, r) localized state and the left (right) lead. Hence, the thermoelectric transport is described by Eqs. (10)-(13), with $E_1$ ($E_2$) replaced by $E_l(E_r)$, In particular, the thermopower coefficients S and $S_p$ are completely determined at the left and right boundaries, despite the fact that all the transport coefficients are determined by both boundaries and "bulk".

Figure 8A:
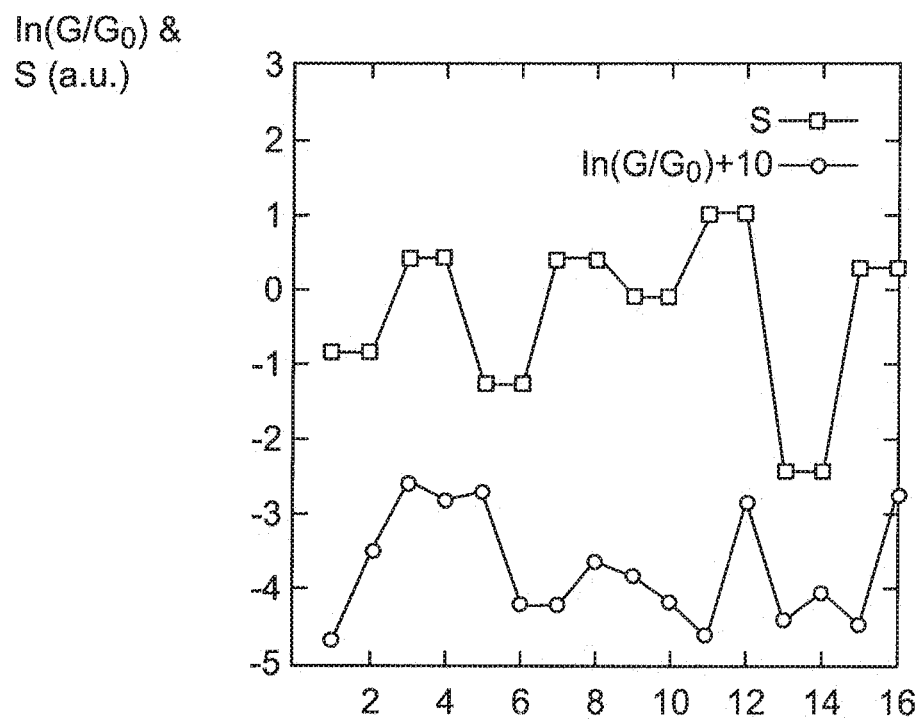
FIG. 8a shows the conductance, ln(G/G$_0$), and thermopower, S; the abscisa gives the number of computations, Ncom. At each odd N$_{com}$, a new random resistor network is generated, and at the subsequent computation, only the central part of the network (within [W/(4L$_M$), 3W/(4L$_M$)]) is replaced by another random configuration. The thermopower is unchanged, while the conductance is more significantly modified. The parameters are $\xi$=0.1, T$_0$=3000, T=20, W=24.5, and L$_M$=0.6.
Figure 8B:
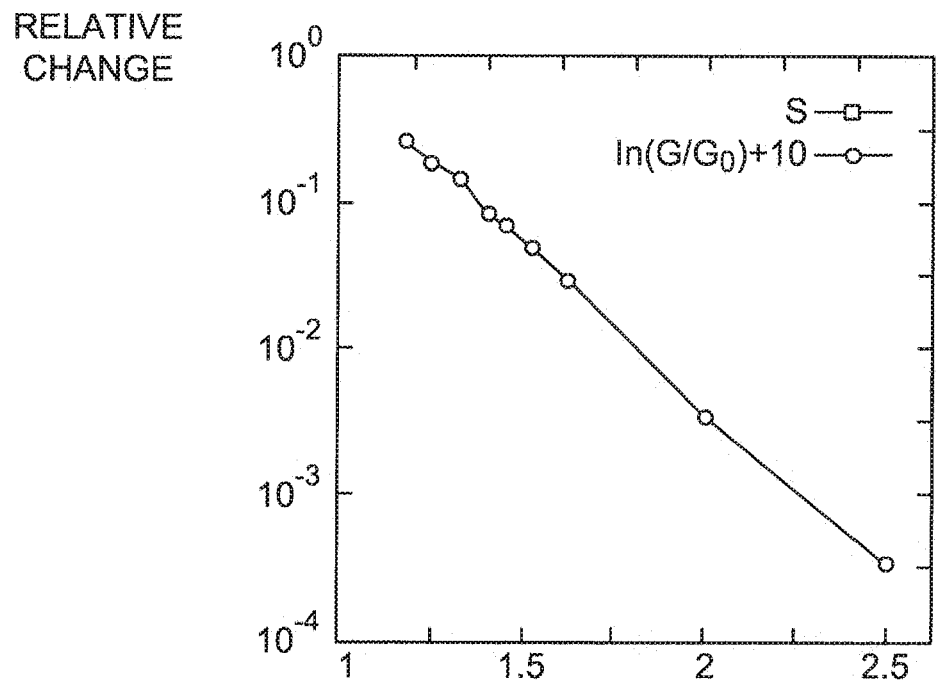

In the genuine variable-range hopping regime, the result is similar: S and Sp are determined by the resistors closed to the left and right boundaries, within a distance comparable to the Mott length $L_M \sim (\eta_c/2)\xi_l$, where $\eta_c=\ln(RG_0)$; R is the resistance of the system and $G_0=(e^2/k_BT)\Gamma_{in}$. This result is confirmed by numerical simulations. FIG. 8a depicts results for the thermnnopower S and the conductance G, which demonstrate the sensitivity of G to changes of the sample's configuration, to which S is practically immune. As can be further seen in FIG. 8b, sites located away from the boundaries have an exponentially minute effect on the latter.

A second non-limiting example of an embodiment relates generally to "High-ZT Thermoelectric Activated Transport Above An Effective Barrier" and specifically relates electron transport through a barrier bridging two conducting leads is considered as a model system. The barrier is low (but higher than the thermal energy $\kappa_B T$) and wide so that transport is dominated by thermal activation. The leads have slightly different temperatures and chemical potentials. The linear transport ("Onsager") matrix is evaluated and found to be very favorable for thermoelectric energy conversion. This is due to the fact that each transferred electron carries an energy roughly equal (within $\kappa_B T<W$) to the barrier height W. The purely electronic figure of merit is given by;

$$ZT \approx \left[\frac{W}{kBT}\right]^2.$$

In thermoelectric transport temperature differences can be converted to (or generated by) electric voltages. Such phenomena have already found several useful applications. The need for higher performance thermoelectrics as well as the pursuit of understanding of various relevant processes (especially the inelastic ones) motivated a significant research effort. Theory predicts that high values of the thermopower follow when the conductivity of the carriers depends strongly on their energy near the Fermi level, EF. In fact, in bulk systems, the thermoelectric effects come from the electron-hole asymmetry which is often, unfortunately, rather small. It is known that the thermoelectric performance is governed by the dimensionless figure of merit ZT, where T is the common, average, temperature of the system and $Z=GS^2/[K_e-K_{ph}]$, with G being the electrical conductance, S the Seebeck coefficient, and Ke and Kph the electronic and the phononic heat conductances, respectively. Both Ke and Kph can be smaller in nanosystems than opening a route for better thermo-electrics.

The Junction Model.

Figure 9:
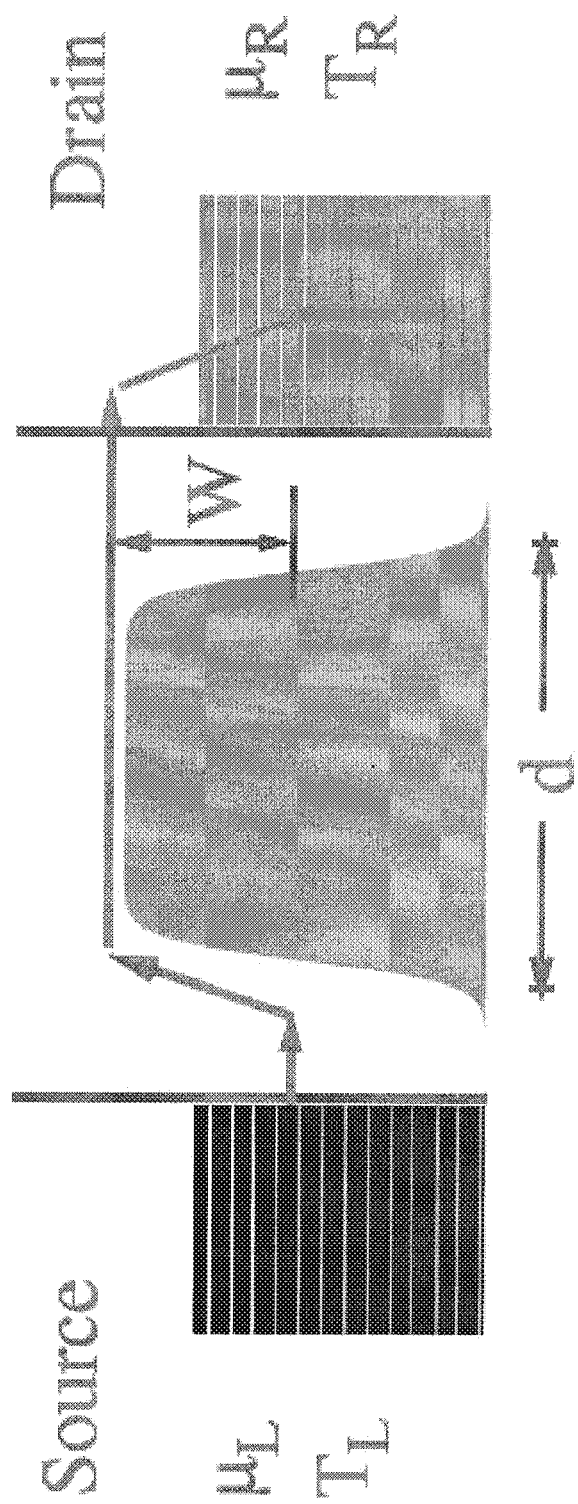
FIG. 9 shows the suggested device: a long (d>>characteristic tunneling length) and low ($\mu$>>W>>$\kappa$BT) barrier separating two electron gases. The transferred electron gets an energy W W±O(k$_B$T) from the LHS thermal bath and deposits it in the RHS one.

Here we consider a very simple system where the electronic transport is effectively funneled to a narrow band. It is contemplated, an ordinary tunnel junction in one dimension (1D, generalized later), depicted in FIG. 9. The barrier is chosen so that its height W (measured from the averaged chemical potential $\mu$) and thickness, d, satisfy $$\mu \gg W \gg k_B T; d \gg h/\sqrt{2\ mW},\ 1/k_F. \quad (1)$$

Thus the dominant transport is via thermal activation above the barrier and not by quantum-mechanical tunneling. It is assumed that the barrier is tapered (see FIG. 9) so that the transmission through it changes rather quickly from 0 to 1 when the electron energy E increases through W This is certainly the case in the 1D clean tunnel junction of the type discussed here, or in the quantum point contact. Its validity in a high dimensional system will be confirmed later on. When some disorder exists, rendering the electron motion diffusive, it makes sense that the transmission still changes from 0 to 1 when the electron energy increases through W.

This increase may become slower than in clean systems, but that should not change the qualitative behavior.

Qualitative Consideration and Results, Two-Terminal Figure of Merit.

A significant feature of our setup is that the electronic heat conductance can be made to be very small while the thermopower stays finite $$K_e = K_e^0 - GS^2 \ll K_e^0, \quad (2)$$

where G is the conductance, S the thermopower $K_e$ the electronic thermal conductance (defined at vanishing electrical current) while $K_e^0$ can be termed a "bare" thermal conductance (just the coefficient relating thermal current to the temperature difference, with the full thermoelectric current flowing). As mentioned above, the largest two-terminal figure of merit is achieved in systems with the smallest Ke/GS2. Here this ratio is very small, and then Z is limited by Kph between the two metallic contacts [see Eq. (7) of this example below]. Kph can be small in nanosystems. The system is then expected to possess a high figure of merit. Another way to understand the situation (shown by the formulae below) is that S is the average energy transferred by an electron, divided by e, while $K_e^0$/G is the average of the square of that energy, divided by e2. Therefore Ke/G is proportional to the variance of that energy. The latter obviously vanishes for a very narrow transmission band. In this case the transmission band is the range of a few KBT above W. Thus, Ke is of the order of (κBT/W)2.

Formulation of Transport and Calculation of Coefficients in One Dimension (1D).

The thermoelectric linear transport problem is fully characterized for this 2-terminal situation, by:

$$\begin{pmatrix} I_e \\ I_Q^e \end{pmatrix} = \begin{pmatrix} G & L_1 \\ L_1 & K_e^0 \end{pmatrix} \begin{pmatrix} \delta\mu/e \\ \delta T/T \end{pmatrix}, \quad (3)$$

where Ie is the charge current and $I_Q$ the heat current, $\delta T = T_L - T_R$ and $\delta\mu/e \equiv V$ is the voltage between the left and right terminals. The 2*2 matrix contains the regular conductance G, the bare electronic thermal conductance $K_e^0$, and the (off-diagonal) thermoelectric coefficients L1. That the latter two are equal is the celebrated Onsager relation (valid for time-reversal symmetric systems). We remind the reader that S=L1/G. All currents and transport coefficients in Eq. (3) of this example are given in 1D in terms of the energy-dependent transmission of the barrier, which we take as $\tau(E) \cong \Theta(E-W)$. We measure all energies from the common chemical potential μ are measured. The currents are $$I = \frac{2e}{h} \int_0^\infty dE [f_L(E) - f_R(E)] \tau(E), \quad (4)$$

$$I_Q = \frac{2}{h} \int_0^\infty dE [f_L(E) - f_R(E)](E) \tau(E).$$

and hence $$G = \frac{2e^2}{h} \int_W^\infty dE f(E)[1 - f(E)]/k_B T, \quad (5)$$

$$L_1 = \frac{2e}{h} \int_W^\infty dE f(E)[1 - f(E)]\frac{E}{k_B T},$$

-continued $$K_e^0 = \frac{2}{h} \int_W^\infty dE f(E)[1 - f(E)]\frac{E^2}{k_B T},$$

With $$f(E) = 1 / \left[\exp\left(\frac{E}{k_B T}\right) + 1\right]$$

being the Fermi function. It reduces for W≫κBT to the Boltzmann distribution, and then $$f(E)[1 - f(E)] \simeq \exp\left(-\frac{E}{k_B T}\right).$$

Then $$\langle E \rangle = \frac{eL_1}{G} = k_B T(x_w + 1), \quad (6)$$

$$\langle E^2 \rangle - \langle E \rangle^2 = (k_B T)^2 [(x_w^2 + 2x_w + 2) - (x_w + 1)^2] = (k_B T)^2,$$

with χw=W/(κBT).

From the transport coefficients one readily obtains the figure of merit:

$$ZT = (ZT)_e \frac{K_e}{K_e + K_p} \quad (7)$$

with $$(ZT)_e = \frac{\langle E \rangle^2}{\langle E^2 \rangle - \langle E \rangle^2} = (x_w + 1)^2 = \left(\frac{W}{k_B T} + 1\right)^2. \quad (8)$$

In two and three dimensions (d=2, 3), the calculation proceeds similarly. The energy is the sum of the longitudinal part which goes over the barrier and the transverse part which should be integrated upon. The latter has the usual density of states in d−1 dimensions. This is E-½ for d=−2 and const for d=3. The overall factors do not matter for Z. The final result differs from Eq. (8) of this example just by numerical factors. At d=2, the result is:

$$(ZT)_e = \frac{2}{3}\left(\frac{W}{k_B T} + \frac{3}{2}\right)^2 \quad (9)$$

The results for d=3 again contain just different numerical factors. The large order of magnitude of ZT remains. The advantage of the last, d=3, case is twofold: it is easier to make (two thick layers of the conducting material, separated by an appropriate barrier) and the total current for given W, and hence the power, is proportional to the cross-section of the device.

Realizations of the Model.

A vacuum junction has too high a barrier for most applications. The ballistic quantum point contact is a very effective realization of the model, when biased in the pinch-off regime and in the region where activated conduction is dominant. It requires however rather high technology and can handle only small powers. To effectively achieve the requirements of the model, are embodiments as follows:

A metal-semiconductor-metal junction, with a properly chosen difference between work function and electron affinity (an example might be Au-p-type Si-Au). A large area will increase the power of the device.

A superlattice separating the two metallic electrodes, where the Fermi level is inside the gap between the "valence" and a "conduction" bands of the superlattice. Electron-hole symmetry should be strongly broken either by intrinsic lack of band symmetry or by the placement of EF away from the middle of the gap (see below). Highly-doped semiconductors can be substituted for the metallic electrodes.

For semiconducting systems, in an embodiment, first an intrinsic small-gap semi-conductor, such as BiTe, the current work-horse of applied thermoelectricity. The first thought would be that since conductivity is thermally activated, with effectively a Boltzmann distribution at temperatures much below the gap, it is a simple realization of our model. This would be the case only if electron-hole symmetry will be strongly broken.

If that symmetry prevails, the electron and hole thermopowers will cancel. That symmetry breaking can be achieved by judicious selective doping and alloying, and seems to dominate the art of the present manipulations of BiTe and its derivatives. However, what is proposed here is a different approach: let a larger band-gap semiconductor, even Si, Ge, graphite, or a member of the GaAs family, bridge two layers of metal so chosen that their Fermi level is significantly closer to either the conduction or the valence band. In a large temperature regime this will, as discussed in the above, realize our activated junction model. In another embodiment, the model is via such a semiconductor, e.g., n-doped such that the Fermi level is, say, (5-10) $\kappa_B T$ below the conduction band and much further from the valence band. The conduction band should then play the role of our activation barrier.

A third non-limiting example of an embodiment relates to "Semiconductor Junction Thermoelectric Devices: Avoiding Electron-Hole Cancelations and Improving Performance".

Two schemes of thermoelectric devices based on p-i-n and $p_+$-$p_-$ (or $n_+$-$n_-$) junctions we examined. The unifying key feature is the avoidance of the cancelation of the electron and hole contributions to the relevant thermopower. This is achieved in a three-terminal geometry or with a homopolar two-terminal one. The three-terminal thermoelectric device is based on a p-i-n junction where the intrinsic region is contacted with a hot reservoir whereas the p and n regions are at lower temperatures. In the two-terminal one electrons or holes experience step-like barrier transport. The figure of merit and the power factor in both schemes is estimated and find that they can be enhanced in certain parameter regimes. Moreover, the figure of merit of the junction can be higher than that of the uniformly-doped phase of the same material.

Thermoelectric energy conversion has stimulated much research on fundamentals and applications for decades. For a long time, people strove to find good thermoelectric materials where the figure of merit ZT is high. However, $ZT \equiv T\sigma S^2/(\kappa_e+\kappa_p)$ is actually limited by several competing transport properties, the conductivity $\sigma$, the Seebeck coefficient S, and the electronic (phononic) thermal conductivity $\kappa_e$ ($\kappa_p$), which makes high ZT hard to achieve. Mahan and Sofo (henceforth "M-S") proposed to analyze and approach high ZT, separating it into two factors: (A) $T\sigma S^2/\kappa_e$ and (B) $\kappa_e/(\kappa_e+\kappa_p)$. By recognizing that the electronic transport quantities, S and $\kappa_e/\sigma$, are related to the mean and the variance of E–µ (the heat transferred by an electron at energy E with µ being the chemical potential), over the transport distribution function, namely the energy-dependent conductivity $\sigma(E)$, they were able to obtain $$\frac{T\sigma S^2}{\kappa_e} = \frac{\langle E-\mu\rangle^2}{\langle (E-\mu)^2\rangle - \langle E-\mu\rangle^2}. \tag{1}$$

The average is taken with respect to $\sigma(E)$. According to M-S, high ZT can be achieved (i) by increasing the factor (A) through decreasing the variance via a sharp structure in $\sigma(E)$, such as a narrow electronic band away from µ, and (ii) by reducing the ratio $\kappa_p/\kappa_e$. Following this, there were many proposals to achieve narrow electronic bands, especially in nanostructures where the enhanced scattering of phonons at interfaces also reduces the phononic heat conductivity.

However, narrow electronic bands do not necessarily lead to high ZT. Specifically, when $\kappa_e \ll \kappa_p$, ZT does not increase with decreasing variance. If $\sigma$ is concurrently decreased, it was argued to even harm ZT and reduce the power factor $\sigma S^2$. The best figure of merit can only be obtained by considering the competition of these factors. Such a competition is also manifested in barrier transmission (thermionic) devices. In thermionic devices, if the barrier height is $W \gg k_B T$, then the average energy is $\langle E\rangle \cong W$, whereas the variance $\langle (E-\mu)^2\rangle - "\langle (E-\mu)"^2 \cong (k_B T)^2$. If $(W-\mu)^2 \gg (k_B T)^2$, factor (A) will be large. However, as only a small fraction of the carriers is transmitted through the device, the electronic charge and heat conductances, $\sigma$ and $\kappa_e$, are reduced. Hence, the factor (B) decreases (and so will the power factor). There is a competition between these factors and an optimization may be achieved via tuning the barrier height W.

Note that the energy-dependent conductivity $\sigma(E)$ is only well-defined for elastic processes. In the direct generalization of the M-S results to include the inelastic processes, E in Eq. (1) of this example becomes the average, Ë of the initial and final energies of the transferred electron. Non-trivial aspects of the inelastic processes are revealed in the "three-terminal thermoelectric devices" proposed very recently. By "three-terminal" we mean a setup with an additional thermal terminal supplying bosons (e.g., phonons) involved in the inelastic processes, besides the two electric terminals. The three-terminal figure of merit characterizes the efficiency of generating electric power by exploiting the temperature difference between the thermal terminal and the other ones. In contrast, the normal "two-terminal" figure of merit measures the efficiency of thermoelectric energy conversion by using the temperature difference between the two electric terminals. We will show below that the full three-terminal figure of merit is $$\check{Z}T = \frac{\langle \omega\rangle^2}{\langle \omega^2\rangle(1+G_{el}/G_{in})(1+K_{pp}/K_{pe}) - \langle \omega\rangle^2}, \tag{2}$$

Here ω (replacing the energy Ë in the two-terminal case) is the boson energy (also equal to the energy exchange of the carrier) in each inelastic process, $G_{el}$ and $G_{in}$ are the conductances of the elastic and inelastic channels, respectively, $K_{pp}$ is the thermal conductance of bosons flowing from the thermal terminal to other terminals, and $K_{pe} = e^{-2}G_{in}\langle \omega^2\rangle$ is the thermal conductance of the heat transfer between the bosons and the electrons. The average is taken with respect to the conductance of each inelastic process. This is the generalization of the theory of M-S to the three-terminal case where the principal quantity is the energy exchange, $\omega$. A direct consequence is that there is no cancelation of the electron and hole contributions to the three-terminal thermopower, as both come with the same $\omega$. We find that a high three-terminal figure of merit $\tilde{Z}T$ requires: (i) the dominance of the inelastic channel $G_{in} \gg G_{el}$, (ii) small variance of the energy change $\langle \omega^2 \rangle - \langle \omega \rangle^2 \ll \langle \omega \rangle^2$, (iii) a large ratio of $K_{pe}/K_{pp}$ which can be realized when $G_{in}$ and $\langle \omega^2 \rangle$ are large or $K_{pp}$ is small. Small $K_{pp}$ can be achieved by, e.g., engineering the interface between the central system and the two electric terminals (see FIG. 7a) to isolate the latter from the thermal terminal.

In contrast to the pursuit of a narrow distribution of $\sigma(E)$ in the M-S proposal, the three-terminal figure of merit benefits from a "selection" of the energy change $\omega$ either via the electronic structure or via the bosonic spectrum so that the variance of $\omega$ can be small. The latter can be achieved also by a small bandwidth of the "selected" bosons. The merits of the three-terminal configuration are several. (i) There is no restriction on the electronic bandwidth [or other parameters prerequisites for a small variance of $\sigma(E)$] as the electronic thermal conductivity Xe does not appear in the three-terminal figure of merit; (ii) Smaller effective boson bandwidths can only make the bosonic thermal conductance $K_{pp}$ smaller, which improves $\tilde{Z}T$; (iii) In general, if, e.g., due to momentum or energy conservation (a "selection"), only the bosons in a small energy range are involved in the transitions, the effective bandwidth can also be small. As a possible candidate, optical phonons have small band-widths (see Table I) and their coupling with carriers is strong. For acoustic phonons the coupling to the carriers can be stronger at large wave vectors/frequencies (e.g., around the Debye frequency) where the density of states of phonons is also large. Besides phonons, there are other bosons which may play the same role, such as magnons, plasmons, and photons.

TABLE I

One branch of the optical phonon energy $\omega_0$ and
its effective bandwith[21] $\delta$ in some semiconductors

| | $\omega_0$ (meV) | $\delta$ (meV) | gap (eV) |
|---|---|---|---|
| HgCdTe[23]: | 19 | 1 | 0~1.5 |
| Si: | 63 | 2 | 1.11 |
| Ge: | 37 | 0.5 | 0.67 |
| GaAs: | 35 | 0.6 | 1.43 |
| InAs: | 27 | 0.4 | 0.36 |
| CdTe: | 21 | 0.4 | 1.49 |

Exploiting the three-terminal thermoelectric configuration as well as the normal two-terminal one, two schemes of embodiments of devices based on p-n and related junctions are provided. In the first scheme, the intrinsic region of a p-i-n junction is contacted with a thermal terminal forming a three-terminal device. We present the device structure and show how it works for semiconductors with extremely narrow-band gaps, such as HgCdTe and superlattices, where the inter-band transitions are assisted by optical phonons. The figure of merit and the power factor of the device is estimated and find that such a device can have a better performance than the normal two-terminal device at the same conditions. Further, we propose and study thermoelectric devices based on the $p_+$-$p_-$ (or $n_+$-$n_-$) junctions are provided. The device is in the two-terminal geometry where $p_+$ (heavily p doped) and $p_-$ (lightly p doped) (or $n_+$ and $n_-$) regions are coupled to reservoirs with different temperatures. We find there are parameter regions where, by tuning the height of the barrier, such junctions can have higher figure of merit and power factor than the same uniformly-doped phase. The unifying feature of the two schemes is the absence of electron-hole cancelations in the relevant thermopower. In the first scheme, the reason is that the three-terminal thermopower is proportional to the energy difference between the final and initial states which is positive definite for both charge carriers. In the second scheme, it is because there is only a single type of carriers. If the system is not far away from that regime, such arguments still offer reliable results on the performance of the devices. The two important quantities are the figure of merit (denoted as ZT and $\tilde{Z}T$ for two- and three-terminal cases, respectively) and the power factor ($P = \sigma S^2$) which are discussed in detail.

Three-Terminal p-i-n Junction Thermoelectric Device

Figure 10A:
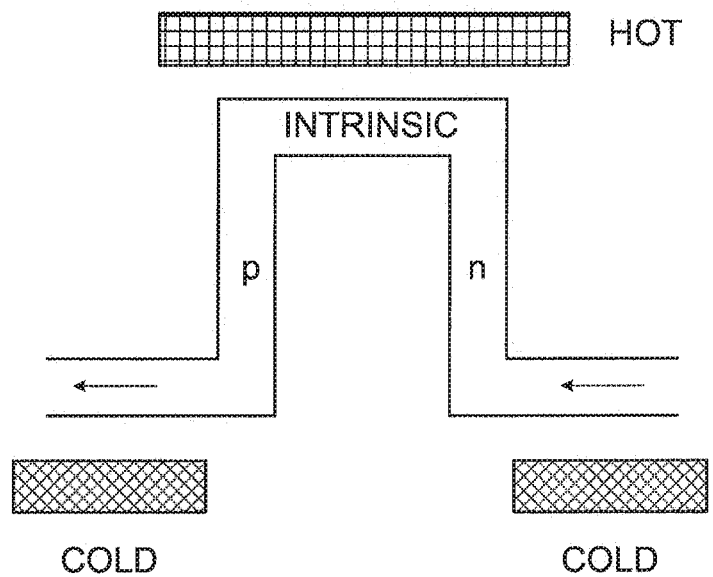
FIG. 10a shows a schematic illustration of the three-terminal p-i-n junction thermoelectric device. The arrows denote the direction of the electric current.
Figure 10B:
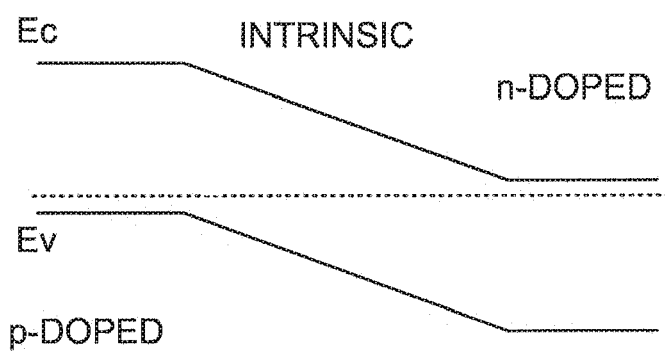
FIG. 10b shows the band structure of the p-i-n junction. The dotted line is the chemical potential at equilibrium.

Most of the treatment applies to a general p-i-n structure. In this invention, it is specifically considered, a p-i-n junction made of "extremely narrow-gap semiconductors". The structure is depicted in FIG. 10. It can be viewed as an analog of the p-i-n photo-diode, where photons are replaced by phonons i.e., the phonon-assisted inter-band transitions lead to current generation in the junction. The band gap is then required to be a bit smaller than the phonon energy. In semiconductors, the optical phonon energy is in acoustic phonons as well as optical ones. For simplicity, here we consider a direct band semiconductor system and assume that the contribution from the optical phonons is the dominant one.

We start by considering only the phonon-assisted transport, ignoring the phononic thermal conductivity and the normal diode transport. The phonon-assisted inter-band transitions generate current flow in the junction, similar to the situation in a photo-diode. In the linear-response regime, the thermoelectric transport equations are written as $$\begin{pmatrix} -e^{-1} I \\ I_Q^e \\ I_Q^{pe} \end{pmatrix} = \begin{pmatrix} e^{-2} G_{in} & L_1 & L_2 \\ L_1 & K_e^0 & L_3 \\ L_2 & L_3 & K_{pe} \end{pmatrix} \begin{pmatrix} \delta\mu \\ \delta T/T \\ \Delta T/T \end{pmatrix}. \quad (3)$$

Here I and $I_Q$ are the electronic charge and heat currents flowing between the two electric terminals, $e > 0$ is the absolute value of the electronic charge, $I_Q^e$ is the heat current from the thermal terminal to the two electric ones, $G_{in}$ is the conductance in the inelastic channel, $K^0$ is related to the electronic heat conductance between the electric terminals, and $K_{pe}$ is that between the thermal terminal and the electric ones. The transport coefficients $L_1$, $L_2$, and $L_3$ are related to the currents induced by the temperature differences (thermopower effect) and the current-induced temperature differences (refrigerator and heater effects). S/z (ST) is the chemical potential (temperature) difference between the two electric terminals, and $\Delta T$ is the difference between the temperature of the thermal terminal and the average temperature of the two electric ones. In such a set-up,[18] the three-terminal Seebeck coefficient and figure of merit are $$S_p = -\frac{eL_2}{TG_{in}}, \quad (4)$$

$$\tilde{Z}T = \frac{L_2^2}{e^{-2} G_{in} K_{pe} - L_2^2},$$

respectively. To obtain the transport coefficients and the figure of merit, we need to calculate the phonon-assisted currents through the system. The Hamiltonian of the interband electron-phonon coupling is $$H_{e-ph} = \frac{1}{\sqrt{V}} \sum_{kq\lambda} M_{q\lambda} c_{k+q}^\dagger d_k^\dagger (a_{q\lambda} + a_{-q\lambda}^\dagger) + H.c., \quad (5)$$

where A is the phonon branch index and $M_{q A}$ is the coupling matrix element, V is the volume of the system, and C (eft) is the operator creating an electron (hole) in the conduction (valence) band. Due to momentum or energy conservations, phonons involved in such processes can be in a small energy range. For indirect band semiconductors, those phonons can be acoustic phonons as well as optical ones. For simplicity, here we consider a direct band semiconductor system and assume that the contribution from the optical phonons is the dominant one.

From Eq. (5) of this example, the electron-hole generation rate per unit volume, $g_p$, is given by the Fermi Golden rule as $$g_p \simeq \frac{2\pi}{\hbar} n_\lambda \overline{|M|^2} \int dE_i dE_j D_p(\omega_{ji}) v_v(E_i) \quad (6)$$
$$v_c(E_j) \times \{f_i(1-f_j)N_B(\omega_{ji}) - (1-f_i)f_j[N_B(\omega_{ji})+1]\},$$

where $f_i$ and $f_j$ are, in general, the non-equilibrium electron distribution functions and $N_B$ is the non-equilibrium distribution of phonons at $w_{ji}=E_j-E_i$. In the linear-response regime, one may use the equilibrium distribution functions at the appropriate reservoirs. As the electrons (holes) are in good contact with the n-doped (p-doped) terminal at the right (left), their distribution is governed by the chemical potential MR (ML) and temperature $T_R$ ($T_L$). The phonon distribution is determined by the temperature of thermal terminal, $T_p$. For order of magnitude estimations, we have replaced the square of the electron-phonon coupling matrix element by the average one $|M|^2$, assuming that the coupling varies slowly with q and A. n\ is the number of relevant branches (assumed to be coupled similarly to the electrons in the intrinsic region) of the optical phonons, and $D_p$ is the effective density of states for the phonons that are involved in the inter-band transition processes. It depends on whether the momentum is conserved and possibly on the width of the phonon band. It is taken to be a Lorentzian $D_p(\mu_{ji})=7/\{7r[(wji-\mu o)^2+7^2]\}$, where u>0 is the typical optical phonon energy and 7 is a measure of the spectra broadening of the involved phonons. $v_v$ and $v_c$ are the densities of states in the valence and conduction bands, respectively. A small disorder which always exists in real systems and relaxes the momentum conservation can enhance the phonon-assisted interband transitions.

The transport coefficients are determined by studying the currents at a given bias and/or a temperature difference. The key relation is the continuity equation.

$$\partial_t n_\alpha(x,t) = \frac{n_\alpha^{eq}(x) - n_\alpha(x,t)}{\tau_\alpha} - \frac{1}{q_\alpha}\partial_x I_\alpha(x,t) + g_p, \quad (7)$$

where $n_\alpha$ (a=e, h) denote the electron and the hole densities in the conduction and valence bands, and na are the equilibrium values of those densities. Ia are the charge currents, $q_\alpha$ are the charges of the electron and the hole, and $T_\alpha$ are the carrier lifetimes, and $g_p$ is the carrier generation rate given in Eq. (6) of this example. The currents $I_\alpha$, which consist of diffusion and drift parts, are $$I_\alpha(x) = e\chi_\alpha n_\alpha(x)\varepsilon - q_\alpha D_\alpha \partial_x n_\alpha(x) \quad (8)$$

where $I_\alpha$ and $D_\alpha$ are the mobilities and the diffusion constants, respectively. They are related by the Einstein relation, $D_\alpha = (k_B T/e)x_\alpha \cdot E = -aE_g/(eL)$ is the built-in electric field in the intrinsic region.

If Boltzmann statistics can be assumed everywhere, the generation rate gp will depend on x very weakly such that its spatial dependence can be ignored. In this situation, the total carrier densities can be divided into two parts, $n_a = n_{a>g} + n_{a>n}$ where $n_{a>g} = g_p T_a$ are the spatially-independent carrier densities generated by the phonon-assisted inter-band transitions and n~ba n are the "normal" densities in the junction, determined by the continuity equation at gp=0. Similarly, the current is divided into two parts, $I_a = +Ig^*$. The current in the normal diode channel can be obtained from Eqs. (7) and (8) with proper boundary conditions, yielding the celebrated rectification current-voltage relation, $I_a = I^\hat{}_s(e^{-S^\hat{}/k_B T}-1)$ with $=eD_a L^{-1} n P_a$ being the saturated currents Ina is the minority carrier density and $L_a$ is the corresponding diffusion length]. Inserting $n_{ag}$ into Eq. (8) of this example, one obtains the currents in the phonon-assisted channel $$I_g^a = e\chi_\alpha g_p \tau_\alpha \varepsilon = -\chi_\alpha \tau_\alpha E_g a L^{-1} g_p < 0. \quad (9)$$

In the linear-response regime, $$g_p = \frac{2\pi}{\hbar} n_\lambda \overline{|M|^2} \int dE_i dE_j D_p(\omega_{ji}) v_v(E_i) v_c(E_j) \times \quad (10)$$
$$f_i^0(1-f_j^0)N_B^0(\omega_{ji}) \times$$
$$\left[\frac{\delta\mu}{k_B T} + \frac{\overline{E}_{ij} - \mu}{k_B T}\frac{\delta T}{T} + \frac{\omega_{ji}}{k_B T}\frac{\Delta T}{T}\right]$$
$$\equiv g_p^0 \left[\frac{\delta\mu}{k_B T} + \frac{\overline{E}_{ij} - \mu}{k_B T}\frac{\delta T}{T} + \frac{\omega_{ji}}{k_B T}\frac{\Delta T}{T}\right],$$

where fi⁰, f⁰, and NB are the equilibrium distribution functions and $$\overline{E}_{ij} \equiv \frac{1}{2}(E_i + E_j).$$

Consequently $$e^{-2} G_{in} = \frac{E_g g_p^0 a}{ek_B TL} \sum_\alpha \chi_\alpha \tau_\alpha, \quad (11)$$
$$L_1 = e^{-2} G_{in} \langle \overline{E}_{ij} - \mu \rangle,$$
$$L_2 = e^{-2} G_{in} \langle \omega_{ji} \rangle,$$
$$K_e^0 = e^{-2} G_{in} \langle (\overline{E}_{ij} - \mu)^2 \rangle,$$
$$L_3 = e^{-2} G_{in} \langle (\overline{E}_{ij} - \mu)\omega_{ji} \rangle,$$
$$K_{pe} = e^{-2} G_{in} \langle \omega_{ji}^2 \rangle,$$

Where $g_p^0$ is the equilibrium transition rate [defined in Eq. 10] and $$\langle \mathcal{O} \rangle = \frac{\int dE_i dE_j F(E_i, E_j) \mathcal{O}}{\int dE_i dE_j F(E_i, E_j)}, \quad (12)$$

$$F(E_i, E_j) = f_i^0 (1 - f_j^0) D_P(\omega_{ji}) v_v(E_i) v_c(E_j) N_B^0(\omega_{ji}).$$

Due to the inelastic nature of the transport, the carrier energies at the p and n terminals are different; the heat transferred between the two terminals is the average one Eij−Ix, whereas the heat difference 10ji is transferred from the thermal terminal to the two electric ones. This is also manifested in the way the temperature ditTferences are coupled to the heat flows in Eq. (10) of this example, ensuring the Onsager relations. An important feature is that the three-terminal Seebeck coefficient $-eL_2/TG_{in}$ is negative definite since $w_{ji}$ (which is positive definite) is the same for both types of charge carriers. In contrast, the two-terminal coefficient, $-eL_1/TG_{in}$, does not possess such property. It can be positive or negative due to the cancelation of the contributions from electrons and holes whereas there is no such cancelation in $L_2$ [see Eq. (11) of this example]. Equation (11) of this example is a generalized example, which has a single microscopic channel. When many inelastic processes coexist, the contribution of each process is weighed by its conductance. From Eqs. (4) and (11) of this example, we find that the ideal three-terminal figure of merit is $$\tilde{Z}T\big|_{ideal} = \frac{\langle \omega_{ji} \rangle^2}{\langle (\omega_{ji})^2 \rangle - \langle \omega_{ji} \rangle^2}. \quad (13)$$

In the single microscopic channel situation where $\omega_{ji}$ is fixed, [18] the above figure of merit tends to infinity. When there are many processes, it becomes finite due to the nonzero variance. We estimate the figure of merit when $\omega_0 \sim E_{ji} \sim k_B T$ and $\gamma$, $k_B T \ll \omega_0$. The variance of $\omega_{ji}$ [see Eq. (12) of this example] is limited by $\gamma^2$ and/or $(k_B T)^2$ whichever is smaller. $\langle \omega_{ji} \rangle^2 \sim \omega_0^2$ is then much larger than the variance. The ideal figure of merit can be very high at low $T/\omega$ or thanks to the narrow bandwidth of the optical phonons. As a comparison, the ideal figure of merit for the photon-assisted transport under the same conditions (i.e., the photonic temperature is equal to the phononic one) is much smaller than the optical-phonon-assisted processes due to the broad energy distribution of photons when $k_B T \gg \gamma$. At very low temperatures, $k_B T \ll \gamma$, the variance of both the phononic and photonic energy are determined by $k_B T$, and the ideal figures of merit of the two are comparable. Admittedly, under such conditions, the inelastic processes are suppressed by the Boltzmann factor $\exp[-\omega/k_B T]$. The power factor is small and as we shall show the realistic figure of merit is also suppressed. The best figure of merit and power factor require an optimization of the working temperature.

Besides the phonon-assisted transport channel, there is the normal diode channel which is dominated by the (elastic) barrier transmission and the diffusion of minority carriers. It contributes to G, $L_1$, and $K_e^0$ as well. In addition there are the "parasitic" heat currents carried by phonons flowing between the two electric terminals and those from the thermal terminal to the other ones. Taking into account all those, the thermoelectric transport equations are written as $$\begin{pmatrix} -e^{-1}I \\ I_Q \\ I_Q^T \end{pmatrix} = \begin{pmatrix} e^{-2}(G_{in} + G_{el}) & L_1 + L_{1,el} & L_2 \\ L_1 + L_{1,el} & K_e^0 + K_{e,el}^{-0} + K_p & L_2 \\ L_2 & L_3 & K_{pe} + K_{pp} \end{pmatrix} \begin{pmatrix} \delta\mu \\ \delta T/T \\ \Delta T/T \end{pmatrix}. \quad (14)$$

Here, $I_Q = I_Q^e + I_Q^p$ is the total heat current between the two electric terminals which consists of the electronic $I_Q^e$ and the phononic $I_Q^p$ contributions; $I_Q^T = I_Q^{pe} + I_Q^{pp}$ is the total heat current flowing from the thermal terminal to the other two, with $I_Q^{pp}$ being the phononic part. $G_{el}$, $L_{1,el}$, and $K_{e,el}^0$ are the contributions ( ) the transport coefficients from the normal diode (elastic) channel. Note that the elastic channel does not contribute to $L_2$ and $L_3$ which are solely related to the inelastic processes. $K_p$ and $K_{pp}$ are the heat conductances for phonons flowing between the two electric terminals and those flowing from the thermal terminal to the other ones, respectively. The three-terminal figure of merit can be obtained by optimizing the efficiency of, say, a refrigerator working at $\delta T = 0$ (but with finite $\delta\mu$ and $\Delta T$). The optimized efficiency is determined by the "three-terminal figure of merit"

$$\tilde{Z}T = \frac{L_2^2}{e^{-2}(G_{in} + G_{el})(K_{pe} + K_{pp}) - L_2^2}, \quad (15)$$

which leads to Eq. (2) of this example. The diode conductance is $G_{el} = (e/k_B T)\Sigma_\alpha I_{ns}^\alpha$. For materials with large $\Sigma_\alpha g_p^0 \tau_\alpha$, the phonon-assisted transport channel can be much more efficient than the normal diode channel. When $G_{in} \gg G_{el}$, the figure of merit becomes $$\tilde{Z}T \simeq \frac{K_{pe}}{K_{pp}}, \quad (16)$$

where, $\gamma$, $k_B T \ll \omega_0$ has been used. There are parameter regimes where the above figure of merit as well as the power factor can be larger than the normal two-terminal ones at the same conditions.

Often $K_p$ and $K_{pp}$ are on the same order of magnitude. We note that $K_p$ is small in (i) several gapless semiconductors such as HgCdTe, PbSnTe, and HgMnTe. Besides (ii) superlattice structures (and other planar composite structures) usually have lower $K_p$ than the bulk materials along the growth direction A favorable set-up is when this direction coincides with the direction of the electric current.

Two-Terminal $p_+$-$p_-$ (or $n_+$-$n_-$) Junction Thermoelectric Device

The purpose of this part of the study is to search for the possibility that a junction can have a figure of merit higher than the uniformly-doped phase of the same material even in the two-terminal configuration. The thermoelectric figure of merit of a p-n junction has been discussed in the literature. It was found that, due to the bipolar thermal current, the figure of merit of a p-n junction cannot exceed unity. This is consistent with the physical picture: the coexistence of electrons and holes not only spoils the Seebeck coefficient (the Seebeck coefficients of electrons and holes have opposite signs, as they carry opposite charges) but also introduces additional bipolar thermal current channels. Hence, it is crucial to increase the electron-hole asymmetry, or even to use junctions with a single type of doping. Indeed, we find that the $p_+$-$p_-$ (or $n_+$-$n_-$) junction, in which one terminal is heavily p (or n) doped whereas the other is lightly doped, can have a better performance.

TABLE II

The parameters $\alpha_+$ and $\zeta_+$ in several common thermoelectric materials. "Type" stands for the type of dopings, "Cri (1)" denotes whether inequality (20) is met, whereas "Cri (2)" is for inequality (22).

| | $\alpha_+$ | $\zeta_+$ | Type | Cri (1) | Cri (2) |
|---|---|---|---|---|---|
| $Ba_8Ga_{16}Ge_{30}$ (Ref. 31) | 2.6 | 0.9 | n | V | X |
| $CsBi_4Te_6$ (Ref. 32) | 1.9 | | n | V | V |
| $CoSb_{2.95}Te_{0.05}$ (Ref. 33) | 2.9 | 7.9 | n | X | X |
| $Bi_2Te_3$ (Ref. 34) | 2.5 | 1.2 | p | V | X |
| $Bi_{0.5}Sb_{1.5}Te_3$ (Ref. 35) | 2.8 | 1.8 | p | X | X |

Figure 10C:
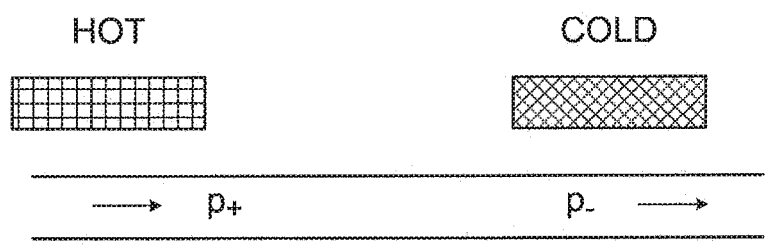
FIG. 10c shows a schematic illustration of the two-terminal p+(heavily p-doped)-p− (lightly p-doped) junction thermoelectric device. The n$_+$-n$_-$ junction is similar except that the electric current direction is reversed.

Here we study the figure of merit and the power factor of a $p_+$-$p_-$ (or $n_+$-$n_-$) junction in the two-terminal thermoelectric configuration. For simplicity, we restrict the following discussion to non-degenerate semiconductors. As shown in FIG. 10c, the $p_+$-$p_-$ terminals are in contact with hot and cold reservoirs, respectively. Holes flowing from the hot region to the cold one experience a step-like energy barrier, and only those having sufficient energy, $\leq E_g/2$, can be transmitted through the barrier. The situation for the $n_+$-$n_-$ junction is similar except that the direction of the electric current is reversed.

To make the issue simpler and clearer, we consider the situation in which the $p_+$ doped region is in the optimal doping and temperature conditions where a high ZT of the material is reached. The figure of merit under such conditions is $$ZT_+ = \frac{\alpha_+^2}{\eta(1+\zeta_+)}, \quad (17)$$

where the absolute value of the Seebeck coefficient in this region is $|S_+|=\alpha_+ k_B/e$, $\eta(k_B/e)^2$ is the Lorenz number (we assume that r varies slowly with doping in the concerned regime), and $\zeta_+=(\kappa_p/\kappa_e)_+$ is the ratio of the phononic thermal conductivity to the electronic one. The zero of energy is set to be at the valence band edge in the heavily doped region at equilibrium. The height of the barrier, W, is the chemical potential difference of the $p_+$ and $p_-$ regions in vacuum, $=\mu_+-\mu_->0$. For simplicity, a step function for the transmission at the junction is assumed. The absolute value of the Seebeck coefficient of the junction is then $$|S| = \frac{1}{eT}\left[\frac{\int dk E_k \Theta(E_{kx}-W)}{\int dk \Theta(E_{kx}-W)} - \mu_+\right], \quad (18)$$

where $E_k=\hbar^2k^2/(2m^*)$ and $E_{kx}=\hbar^2k_x^2/(2m^*)$ with $m^*$ being the effective mass of carriers. Equation (18) gives $|S|\cong(W+rk_BT-\mu_+)/(eT)$ with T being a numerical factor on the order of unity. Using the approximation $rk_BT-\mu_+\cong\mu_+ k_BT$, the absolute value of the Seebeck coefficient of the junction is $|S_+|=(\alpha_++W/k_B)(k_B/e)$. (For non-degenerate semiconductors, the conductivity and the electronic thermal conductivity scale almost linearly with the carrier density. Since only a fraction, $\cong\exp[-W/k_BT]$, of the carriers is transmitted through the junction, the electric conductivity and thermal conductivity are approximately $\cong\sigma \exp[-W/k_BT]$ and $\cong\kappa_e\exp[-W/k_BT]$, respectively. Hence the figure of merit of the junction is $$ZT \simeq \left(\frac{\alpha_++u}{\alpha_+}\right)^2 \frac{1+\zeta_+}{1+e^u\zeta_+}ZT_+, \quad (19)$$

with $u=W/k_BT$. This figure of merit can be larger than the bulk one, $ZT_+$, when, $$\alpha_+ < 2 + \frac{2}{\zeta_+}. \quad (20)$$

The power factor, $P=\sigma S^2$, is given by $$P \simeq e^{-u}\left(\frac{\alpha_++u}{\alpha_+}\right)^2 P_+ \quad (21)$$

which can be larger than the bulk one, $P_+$, when $$\alpha_+ < 2 < 2 + \frac{2}{\zeta_+}. \quad (22)$$

i.e., the absolute value of Seebeck coefficient is smaller than 170 μV·k$^{-t}$. To check whether the above criteria can be satisfied for realistic materials, we present the corresponding parameters of several common thermoelectric materials in Table II of this example. It is seen that for some of the materials these criteria are satisfied. This opens the possibility to obtain higher figures of merit and power factors in $p_+$-$p_-$ or $n_+$-$n_-$ junctions.

Figure 11A:
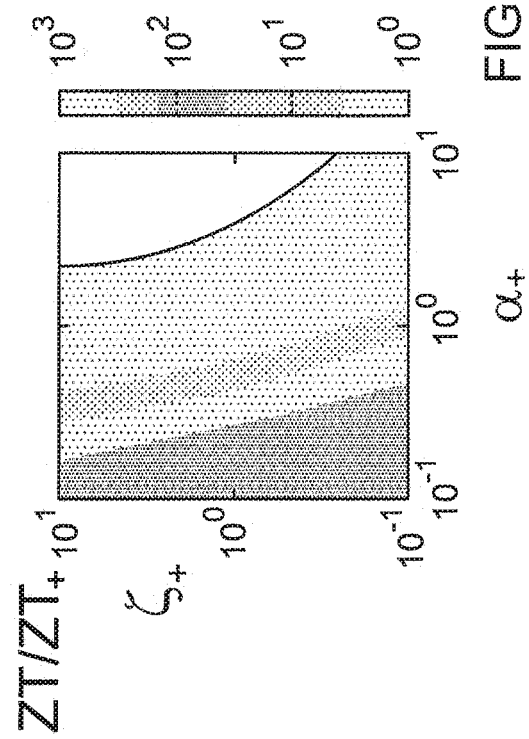
FIG. 11a shows the ratio ZT/ZT$_+$ as a function of u at different $\alpha_+$ and $\zeta_+(\alpha_+, \zeta_+)$=(1, 1) (solid curve), (0.2,0.2) (dashed curve), (1.5,0.2) (dotted curve), and (0.2,1.5) (dot-dashed curve).
Figure 11C:
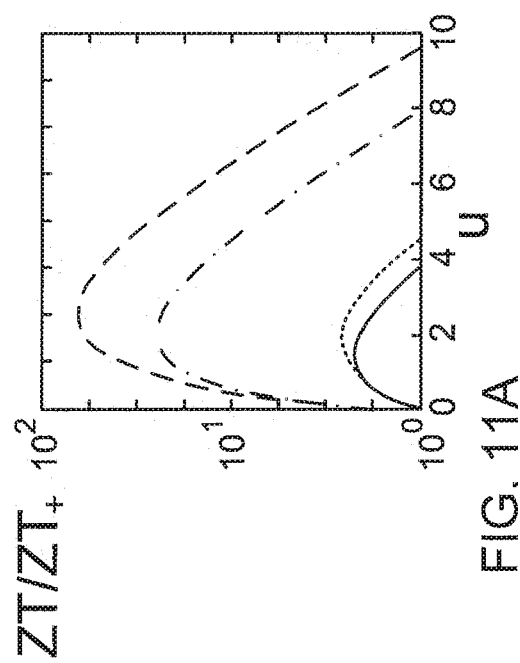
FIG. 11c shows u$_m$ the value at which such a maximum is reached, as functions of $\alpha_+$ and $\zeta_+$.
Figure 11B:
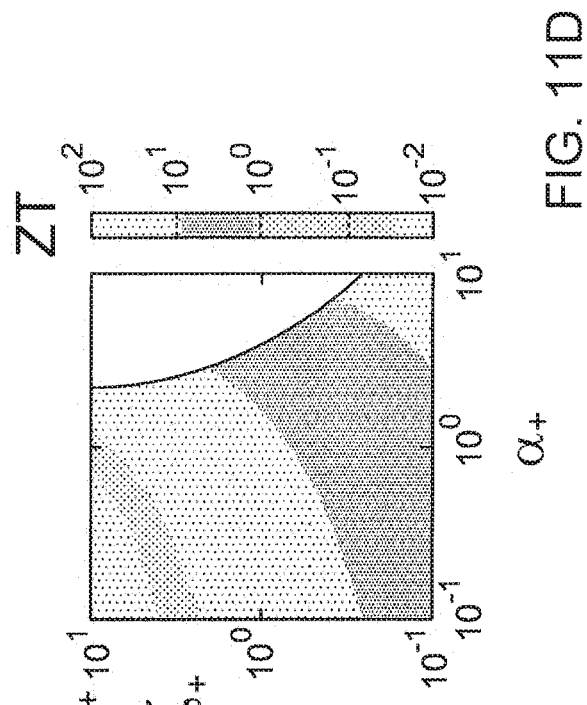
FIG. 11b shows the maximum of the ratio of ZT/ZT$_+$.
Figure 11D:
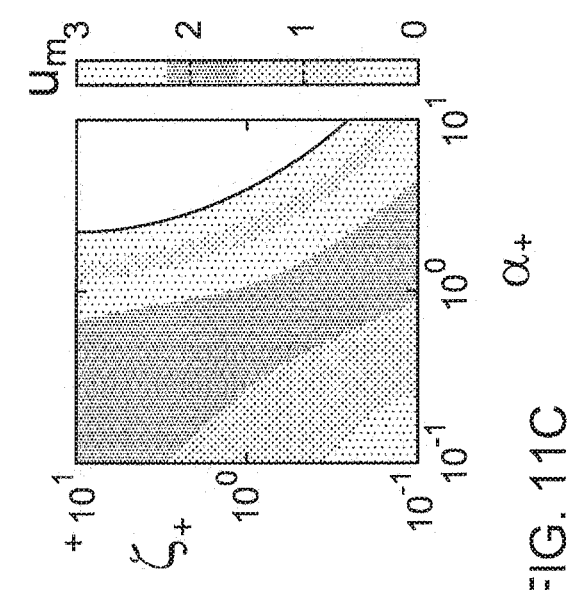
FIG. 11d shows the figure of merit of the junction ZT when $\eta$+2. The blank region does not satisfy inequality (20).

We plot the u-dependence of the ratio $ZT/ZT_+$ at several different sets of parameters in FIG. 11a. The figure indicates that the proposed scheme can indeed enhance ZT significantly when $\alpha_+$ is small, i.e., for small absolute values of the Seebeck coefficient. Plots of the maximum of the ratio of $ZT/ZT_+$ as well as $\mu_{m+}$ the value at which such a maximum is reached, as functions of $\alpha+$ and $\zeta+$ are presented in FIGS. 11b and 11c, respectively. The figure of merit of the junction ZT is plotted in FIG. 11d, from which we can see that small $\zeta+$ and large $\alpha+$ are favorable for high ZT. It is proposed and studied two schemes of thermoelectric devices using p-n and related junctions. The first scheme is based on the "three-terminal" geometry of thermoelectric applications, where inelastic processes play a crucial role. It has been shown that a high thermoelectric figure of merit can be achieved in this geometry in several nanosystems, where only one microscopic channel in which the relevant electronic energy is fixed, is available. In this paper we derived the figure of merit for the multi-channel case. We find that, when only the inelastic processes are considered, the figure of merit is the ratio of the square of the mean value of energy difference between final and initial states to its variance with the average weighed by the conductance of each microscopic process. A small variance in the energy exchange is then favorable for a high figure of merit. The realistic figure of merit including other processes, Eq. (2) of this example, is also derived. It is found that a strong carrier-boson coupling as well as the suppression of elastic transport channels are also prerequisites of a high figure of merit. Fortunately, optical phonons which have narrow bandwidths and strong coupling with carriers, are provided by nature. The suppression of the elastic transport channels can be achieved in specific p-n junction structures. Thanks to those, the proposed three-terminal device can have figures of merit and power factors higher than those of the usual two-terminal device at the same conditions.

The second proposal is to enhance the thermoelectric efficiency by exploiting $p_--p_+$ (or $n_+-n_-$) junctions in the two-terminal geometry. We show that in certain parameter regions the junctions can have a better thermoelectric performance than the uniformly-doped phase of the same material. Note that the cancelation of the Seebeck coefficient of electrons and holes in p-n junction is eliminated in such junctions ($p_+-p_-$ or $n_+-n_-$) with only a single type of carriers in the two-terminal geometry. It is also noted that there is no such cancelation in three-terminal thermoelectric device which exploits the three-terminal Seebeck coefficient.

In comparison with the existing literature, M-S suggested a narrow electronic band for elastic two-terminal transport to achieve high ZT. When generalized to inelastic processes where the initial $E_i$ and final $E_f$ energies are different, a high ZT is possible when the distribution of the average energy $\bar{E}=(E_i+E_f)/2$ is narrow in two-terminal geometry, or when the distribution of the energy difference $\omega=E_f-E_i$ is narrow in three-terminal geometry. The latter can be achieved via the narrow bandwidth of optical phonons or by controlling the initial and final electronic states by a barrier higher enough than T.

The following is a comparison of the three-terminal figure of merit of optical phonon-assisted transport channel with the acoustic phonon or photon (thermal radiation)-assisted channel.

For comparison, we calculate here the figure of merit of the photon (thermal radiation)-assisted transport channel at the same conditions as the phonon-assisted transport discussed in the main text. Acoustic phonons (or other bosons) with a linear dispersion are similar to photons. In the present case the photons come from the thermal radiation emitted from a thermal reservoir. The latter should have a slightly higher temperature than the carrier system in the intrinsic region of the p-n junction under thermoelectric power supply conditions. Electronhole pairs are generated in the dynamic processes and current is created. The figure of merit of such processes can be calculated similarly to what has been done for the phonon-assisted transport channel. For parabolic bands, the photon-assisted inter-band transition rate is given by $$g_{pt} \propto \int d\epsilon \epsilon^{1/2} N_B(\epsilon+E_g) v_p(\epsilon+E_g)/(\epsilon+E_g), \quad (A1)$$

where $\delta+E_g$ is the electron-hole pair energy, $N_B$ is the Bose distribution, and $v_D(x) \propto x^2$ is the photon density of states. The ideal figure of merit is given by Eq. (13) of this example where now $$\langle O \rangle = \frac{\int d\epsilon F_p(\epsilon) O}{\int d\epsilon F_p(\epsilon)}, \quad (A2)$$

with $F_p(\epsilon)=\epsilon^{1/2} N_B(\epsilon+E_g) v_p(\epsilon+E_g)/(\epsilon+E^g)$.

e.g., $E_g=3k_BT$,
the ideal figure of merit is $$\tilde{Z}T \cong 1.6 \quad (A3)$$

which is much smaller than that of the optical-phonon-assisted processes due to the broad energy distribution of photons as compared with that of the optical phonons. A small ideal figure of merit often entails a reduced realistic figure of merit, unless the coupling between the carriers and the photons is strong. A narrow distribution of spectra can be obtained by confinement, such as in a cavity with only a single mode that is preferentially occupied. In that case we expect the cooling efficiency to be largely enhanced. We note that although at low temperatures, $k_BT \ll E_g$, the variance of $\omega$ is essentially limited by $k_BT$ in both photonic and phononic cases, such a temperature regime is not favorable for thermoelectric efficiency because the inelastic transition rates are limited by $\exp[-E^g/k_BT]$ which suppresses the power factor and reduces the realistic figure of merit. In the proposed scheme of the three-terminal device, as the thermal terminal provides both phonons and photons (the latter from thermal radiation), there are also photon-assisted transport processes. Those processes reduce the figure of merit of the device as shown above. This reduction can be negligible when the energy injected into the central system from the thermal terminal is mainly carried by phonons. In reality, the phononic thermal conductivity can indeed be much larger than the radiative one.

It is observed that the inter-band transition rate $g_p^0$ in Eq. (11) of this example also describes the recombination processes due to phonon-assisted inter-band transitions. Hence, in intrinsic semiconductors, $\tau_e^{-1}=\tau_h^{-1}\equiv\tau^{-1}=(g_p^0+\ldots)/n_i>g_p^0/n_i$, where ... denotes the contributions from other processes, such as the radiative recombination processes. We show below that in some semiconductors like HgCdTe, the phonon-assisted process may be more important, if the band-gap is comparable with the optical phonon energy. To keep the discussion general, we introduce a parameter $0<\xi_1<1$ to scale $\tau^{-1}=g_p^0/(\xi_1 n_i)$ hence $g_p^0\tau=\xi_1 n_i$ and $$G_{in} \sim e^2(k_BT)^{-2}E_g\xi_1 n_i = \sum_\alpha D_\alpha L^{-1}, \quad (B1)$$

where we assumed $\tau_e \sim \tau_h \sim \tau$ in the intrinsic region.
The elastic conductance, pertaining to the rectification current-voltage relation is $$G_{el} \sim e^2(k_BT)^{-1}n_i^2 N_d^{-1} \sum_\alpha D_\alpha L_\alpha^{-1}, \quad (B2)$$

where the doping (and majority carrier) densities in both n and p regions are taken to be the same and denoted as $N_d$. Then $$\frac{G_{el}}{G_{in}} \sim \frac{k_B T n_i \sum_\alpha D_\alpha L_\alpha^{-1}}{\xi_1 E_g N_d \sum_\alpha D_\alpha L^{-1}}, \text{ and consequently} \quad (B3)$$

$$\frac{G_{el}}{G_{in}} \sim \frac{k_B T}{E_g} \frac{n_i}{\xi_1 N_d} \frac{L}{L_\alpha}. \quad (B4)$$

A small ratio can be achieved in the regime $k_BT \ll E_g$ and $L \ll L\alpha$, ignoring the contribution from the normal diode channel. We next introduce a second parameter $\xi_2$ to characterize the ratio $\xi_2 = K_e/K_p$ in the it or p regions. (For simplicity, we assume that the transport properties in the n and p regions are the same.) For $K_{pp} \cong K_p$, the figure of merit becomes $$\tilde{Z}T \simeq \frac{K_{pe}}{\xi_2^{-1} K_e} \sim \frac{e^{-2} G(k_B T)^2 \left(\frac{E_g}{k_B T}\right)^2}{\xi_2^{-1} e^{-2} G_{el}(k_B T)^2 e^{E_p/k_B T}}. \quad (B5)$$

We have estimated the ratio of the conductivity in the doped region to that in the diode channel as the ratio of the majority carrier density to the minority one$\cong \exp[E^g/k_B T]^{27}$. In the n and p regions, the Wiedemann-Franz law gives $K_e \sim (k_B T)^2 e^{-2} G$. Then $$\tilde{Z}T \sim \xi_1 \xi_2 \frac{N_d}{n_i} \frac{L_\alpha}{L} \left(\frac{E_g}{k_B T}\right)^3 e^{-E_g/k_B T}. \quad (B6)$$

At $E_g/(k_B T)=3$, the maximal ZT is reached, which is $(ZT \cong \xi_2/(\xi_2+1))$ when $\xi_1(N_d/n_i)(L_\alpha/L)>1$. This can be larger than the two-terminal figure of merit in the doped regions $(ZT \approx \xi_2/(\xi_2+1))$ when $\xi_1(N_d/n_i)(L_\alpha/L)>1$. when $\xi_1(N_d/n_i)(L_\alpha/L)>1$. In I-IgCdTe, the density generation rate due to radiative process is about $10^{24}$ m$^{-3}$s$^{-1}$ for $E_g \sim 20$ meV and T–50 K. For phonon-assisted processes, we estimate from Eq. (10) of this example that $$g_p^0 \sim h^{-1} \overline{|M|^2} n_i^2 \gamma^{-1}, \quad (B7)$$

where n-j$\sim 10^{20}$ m$^3$,[40] $\gamma \sim 1$ meU,[23] and $|M|^2 \sim 10^{-72}$ J$^2$ m$^3$ if one assumes that the inter-band electron-optical-phonon coupling is of the same order of magnitude as that of the intraband one.[41] [This is physically reasonable, as both the conduction and valence bands are mixtures of the $r_8$ and $r_6$ bands in hgTe and CdTe.] The result is $g_p^0 \sim 10^{24}$ m$^{-3}$s$^{-1}$ which is about the same magnitude as that of the radiative processes. Therefore, the factor $\xi_1(N_d/n_i)(L_\alpha/L)$ can be larger than 1 in HgCdTe. The working temperature range is 50~90 K. For silicon based superlattices, the working temperature can be as high as 200~300 K thanks to the high frequency of the optical phonons there. The power factor of the three-terminal device, P~$G_{in}(W_{ji})^2-G_{in}u^2$, can be larger than that of the uniformly-doped phase of the same material, i.e., ~$G_{el}(k_B T)^2$ exp$[E_g/k_B T]$, at the same conditions discussed above. As contemplated herein for embodiments of devices, the thermalization rate of the optical phonons, physically governed by their collisions with other excitations such as carriers and acoustic phonons in the thermal terminal, should be large enough for high power output.

What is claimed:

1. A thermoelectric device comprising:
    a first electrical region in electrical contact with a first electrical terminal;
    a second electrical region in electrical contact with a second electrical terminal; and
    a thermoelectric gate in thermal contact with a heat-conducting thermal terminal, said thermoelectric gate interposed between said first electrical region and said second electrical region, such that said thermoelectric gate is in contact with said first electrical region and with said second electrical region,
        wherein heat is transferred between said heat-conducting thermal terminal and said thermoelectric gate in accordance with current flow between said first terminal and said second terminal; and
    wherein:
        said heat is transferred from said thermoelectric gate to said heat-conducting thermal terminal in accordance with current flow in a first direction;
        said heat is transferred from said heat-conducting thermal terminal to said thermoelectric gate in accordance with current flow in a second direction; or a combination thereof, and
    wherein said thermoelectric device comprises:
        a junction with a positive region, an intrinsic region, and a negative region of a P-I-N junction;
            wherein said positive region is p-doped and said negative region is n-doped.

2. The thermoelectric device of claim 1, further comprising a temperature-control configuration configured to cause said first electrical region to assume a first temperature and said second electrical region to assume a second temperature different than said first temperature.

3. The thermoelectric device of claim 1, wherein a quantity of said heat transfer is proportional to a quantity of said current flow.

4. The thermoelectric device of claim 1, wherein said heat-conducting thermal terminal is thermally isolated from both said first electrical region and said second electrical region.

5. The thermoelectric device of claim 1, wherein:
    said first electrical region is in a first electrical localized state; and
    said second electrical region is in a second electrical localized state.

6. The thermoelectric device of claim 1, comprising a junction with a positive region, an intrinsic region, and a negative region of a P-I-N junction,
    wherein:
        the thermoelectric gate is the intrinsic region of the P-I-N junction;
        the first electrical region and the second electrical region are different regions, each of the first electrical region and the second electrical region selected from the group consisting of the positive region of the P-I-N junction and the negative region of the P-I-N junction.

7. The thermoelectric device of claim 1, wherein said thermoelectric gate includes a superlattice.

8. The thermoelectric device of claim 1, wherein:
    said first electrical terminal is operative to impart a first energy $E_1$ to charge carriers in said first electrical region;
    said second electric terminal is operative to impart a second energy $E_2$ to charge carriers in said second electrical region;
    such that a difference between said second energy $E_2$ and said first energy $E_1$ is an energy differential W.

9. The thermoelectric device of claim 8, further comprising a temperature-control configuration configured to cause the first electrical region to assume a first temperature and the second electrical region to assume a second temperature different than the first temperature.

10. The thermoelectric device of claim 8, wherein the energy differential W is substantially greater than the product of the temperature of the thermoelectric gate and Boltzmann's constant, k.

11. The thermoelectric device of claim 8, wherein any one of the charge carriers traverses the thermoelectric gate responsively to acquiring energy substantially equal to the energy differential W.

12. A method for transferring heat using a thermoelectric device comprising;

providing a thermoelectric device comprising:
  a first electrical region in electrical contact with a first electrical terminal;
  a second electrical region in electrical contact with a second electrical terminal; and
  a thermoelectric gate in thermal contact with a heat-conducting thermal terminal, said thermoelectric gate interposed between said first region and said second region, such that said thermoelectric gate is in contact with said first electrical region and with said second electrical region,
wherein heat is transferred between said thermal terminal and said thermal gate is in accordance with current flow between said first electric terminal and said second electric terminal; and wherein:
  said heat is transferred from said thermoelectric gate to said heat-conducting thermal terminal in accordance with current flow in a first direction;
  said heat is transferred from said heat-conducting thermal terminal to said thermoelectric gate in accordance with current flow in a second direction; or
  a combination thereof, and
  wherein said thermoelectric device comprises:
    a junction with a positive region, an intrinsic region, and a negative region of a P-I-N junction;
    wherein said positive region is p-doped and said negative region is n-doped;
      adjusting current passing between said first electrical terminal and said second electrical terminal; and
      transferring heat between said thermoelectric gate and said heat-conducting thermal terminal in accordance with said current passing between said first electrical terminal and said second electrical terminal.

13. The method of claim 12, further comprising causing said first electrical region to assume a first temperature and said second electrical region to assume a second temperature different than said first temperature.

14. The method of claim 12, wherein a quantity of said heat is proportional to a quantity of said current flow.

15. The method of claim 12, wherein said heat-conducting thermal terminal is thermally isolated from both said first electrical region and said second electrical region.

16. The method of claim 12, wherein said thermoelectric device comprises a P-I-N junction comprising a positive region, an intrinsic region, and a negative region, wherein:
  said thermoelectric gate is said intrinsic region of said P-I-N junction;
  said first electrical region and said second electrical region are different regions, each of said first electrical region and said second electrical region selected from the group consisting of the positive region of said P-I-N junction and the negative region of said P-I-N junction.

17. A method for generating electricity using a thermoelectric device comprising;
  providing a thermoelectric device comprising:
    a first electrical region in electrical contact with a first electrical terminal;
    a second electrical region in electrical contact with a second electrical terminal; and
    a thermoelectric gate in thermal contact with a heat-conducting thermal terminal, said thermoelectric gate interposed between said first region and said second region, such that said thermoelectric gate is in contact with said first electrical region and with said second electrical region,
wherein heat is transferred between said thermal terminal and said thermal gate is in accordance with current flow between said first terminal and said second terminal; and wherein:
  said heat is transferred from said thermoelectric gate to said heat-conducting thermal terminal in accordance with current flow in a first direction;
  said heat is transferred from said heat-conducting thermal terminal to said thermoelectric gate in accordance with current flow in a second direction; or
  a combination thereof, and
  wherein said
  thermoelectric device comprises:
    a junction with a positive region, an intrinsic region, and a negative region of a P-I-N junction;
    wherein said positive region is p-doped and said negative region is n-doped;
    employing heat transfer between said thermoelectric gate and said heat-conducting thermal terminal; and
    causing current to pass between said first electrical terminal and said second electrical terminal in accordance with said heat transfer.

18. The method of claim 17, further comprising causing said first electrical region to assume a first temperature and said second electrical region to assume a second temperature different than said first temperature.

19. The method of claim 17, wherein a quantity of said heat is proportional to a quantity of said current flow.

* * * * *